(12) United States Patent
Takahashi et al.

(10) Patent No.: US 12,469,825 B2
(45) Date of Patent: Nov. 11, 2025

(54) POWER SEMICONDUCTOR DEVICE AND POWER SEMICONDUCTOR MODULE EACH HAVING ELECTRODES ON OPPOSING SURFACES OF POWER SEMICONDUCTOR CHIP

(71) Applicant: TOHOKU UNIVERSITY, Sendai (JP)

(72) Inventors: Yoshikazu Takahashi, Sendai (JP); Tetsuo Endoh, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 442 days.

(21) Appl. No.: 17/991,995

(22) Filed: Nov. 22, 2022

(65) Prior Publication Data

US 2023/0170334 A1 Jun. 1, 2023

(30) Foreign Application Priority Data

Nov. 26, 2021 (JP) ................. 2021-192596

(51) Int. Cl.
*H01L 25/07* (2006.01)
*H01L 23/00* (2006.01)
*H10D 30/66* (2025.01)
*H10D 62/832* (2025.01)

(52) U.S. Cl.
CPC ............ *H01L 25/072* (2013.01); *H01L 24/32* (2013.01); *H10D 30/665* (2025.01); *H10D 62/8325* (2025.01); *H01L 2224/2612* (2013.01)

(58) Field of Classification Search
CPC ... H10D 30/665; H10D 62/8325; H01L 24/32
See application file for complete search history.

(56) References Cited

U.S. PATENT DOCUMENTS

| | | | |
|---|---|---|---|
| 2013/0241040 A1* | 9/2013 | Tojo | H01L 23/051 438/123 |
| 2015/0255380 A1 | 9/2015 | Chen | |
| 2017/0053871 A1* | 2/2017 | Nakajima | H01L 25/0652 |
| 2017/0170123 A1 | 6/2017 | Hayashi | |
| 2019/0035770 A1 | 1/2019 | Iguchi et al. | |
| 2022/0045025 A1* | 2/2022 | Hsu | H01L 25/50 |
| 2023/0142930 A1* | 5/2023 | McPherson | H01L 23/49562 257/668 |
| 2024/0014142 A1* | 1/2024 | Morianz | H01L 24/82 |

FOREIGN PATENT DOCUMENTS

| | | |
|---|---|---|
| CN | 112151466 A | 12/2020 |
| EP | 3836208 A1 | 6/2021 |
| JP | 2019-085631 A | 6/2019 |

* cited by examiner

*Primary Examiner* — Michael Jung
(74) *Attorney, Agent, or Firm* — Rabin & Berdo, P.C.

(57) ABSTRACT

A power semiconductor device includes a power semiconductor chip and a fourth electrode. The power semiconductor chip has a first surface and a second surface opposite to each other and includes a first electrode and a second electrode on the first surface thereof, and a third electrode on the second surface thereof. The first electrode is provided in a main cell area of the first surface. The fourth electrode is provided on the first surface of the power semiconductor chip, is electrically connected to the first electrode, and has an overhanging portion that extends outwardly from an outer edge of the power semiconductor chip.

20 Claims, 20 Drawing Sheets

POWER SEMICONDUCTOR DEVICE AND POWER SEMICONDUCTOR MODULE EACH HAVING ELECTRODES ON OPPOSING SURFACES OF POWER SEMICONDUCTOR CHIP

TECHNICAL FIELD

The present invention relates to a power semiconductor device and a power semiconductor module.

BACKGROUND ART

A power semiconductor device is a semiconductor device that handles a large voltage and current and has a switch function, and is used for power control and power conversion in power transmission and distribution systems, trains, hybrid vehicles, electric vehicles, various production facilities, home appliances and industrial machinery. As a module using this power semiconductor device, Japanese Patent Application Laid-open Publication No. 2019-85631 (FIG. 5) discloses a power semiconductor module having the double-side heat release structure where a heat dissipation plate is disposed at the top and bottom thereof.

To make a module using a power semiconductor device, a power semiconductor chip constituting the power semiconductor device needs to be connected to an external terminal through a wire or a lead frame, and then sealed with a resin. The power semiconductor chip is manufactured by forming switching elements on a wafer made of a power semiconductor material such as Si or SiC, and dicing the wafer into pieces. The power semiconductor chip is also referred to as a die. In this power semiconductor chip, a termination structure is formed to surround the periphery of the main cell area (source area, for example) on the first surface. The termination structure is constituted of a guard ring, a field plate, a RESURF structure, or a combination thereof, for example, to mitigate the concentration of electric fields on the first surface.

SUMMARY OF THE INVENTION

When a power semiconductor module is made as described above, one end of the wire or one end of the lead frame needs to be placed above the termination structure without touching the termination structure. Although a lead frame has a larger cross-sectional area than that of a wire, because an area where the one end of the lead frame touches the main cell area of the power semiconductor chip is small, it is difficult to connect the lead frame to the main cell area. If the size of the power semiconductor chip is further reduced, then the area for installing a wire or a lead frame would become even smaller, which makes it harder to reduce size and improve heat dissipation efficiency.

To solve this problem, an object of the present invention is to provide a power semiconductor device and a power semiconductor module with good heat dissipation efficiency even when the power semiconductor chip has a termination structure such as a guard ring, a field plate, and RESURF.

Solution to Problem

Concepts of the present invention are follows.

According to one concept of the present invention, a power semiconductor device, includes: a power semiconductor chip having a first electrode and a second electrode on a first surface, and a third electrode on a second surface that is an opposite side of the first surface, the first electrode being formed in a main cell area; and a fourth electrode formed on the first surface of the power semiconductor chip and electrically connected to the first electrode, the fourth electrode having an overhanging portion that extends outwardly from an outer edge of the power semiconductor chip.

According to one concept of the present invention, a power semiconductor device includes: a plurality of power semiconductor chips each having a first electrode and a second electrode on a first surface, and a third electrode on a second surface that is an opposite side of the first surface, the first electrode being formed in a main cell area; and a fourth electrode electrically connected to the first electrode of each of the plurality of power semiconductor chips, and having an overhanding portion that extends outwardly from an outer edge of each of the power semiconductor chips.

According to one concept of the present invention, a power semiconductor module includes: a plurality of power semiconductor devices belonging to a first group; and a plurality of power semiconductor devices belonging to a second group, wherein each of the plurality of power semiconductor devices of the first group and the second group includes: a power semiconductor chip having a first electrode and a second electrode on a first surface, and a third electrode on a second surface that is an opposite side of the first surface, the first electrode being formed in a main cell area; a fourth electrode disposed to electrically connect to the first electrode of the corresponding power semiconductor chip, and having an overhanging portion that extends outwardly from an outer edge of the corresponding power semiconductor chip; a fifth electrode disposed to electrically connect to the third electrode of the corresponding power semiconductor chip; and a sixth electrode disposed to electrically connect to the second electrode of the corresponding power semiconductor chip, wherein the fourth electrode and the sixth electrode of each of the power semiconductor devices in the first group are arranged to face the same direction as the fifth electrode of each of the power semiconductor devices in the second group, wherein the fourth electrode of each of the power semiconductor devices in the first group, the fifth electrode of each of the power semiconductor devices in the first group, the sixth electrode of each of the power semiconductor devices in the first group, the fourth electrode of each of the power semiconductor devices in the second group, the fifth electrode of each of the power semiconductor devices in the second group; and the sixth electrode of each of the power semiconductor devices in the second group are disposed to electrically connect to corresponding external terminals for the fourth electrodes, the fifth electrodes, and the sixth electrodes of each group.

According to the present invention, it is possible to provide a power semiconductor device and a power semiconductor module with good heat dissipation efficiency even when the power semiconductor chip has a termination structure such as a guard ring, a field plate, and RESURF.

DETAILED DESCRIPTION OF EMBODIMENTS

Below, embodiments of the present invention will be explained in detail with reference to figures. Designs described in the embodiments of the present invention may be appropriately modified without departing from the scope of the present invention.

Embodiment 1

Figure 1:
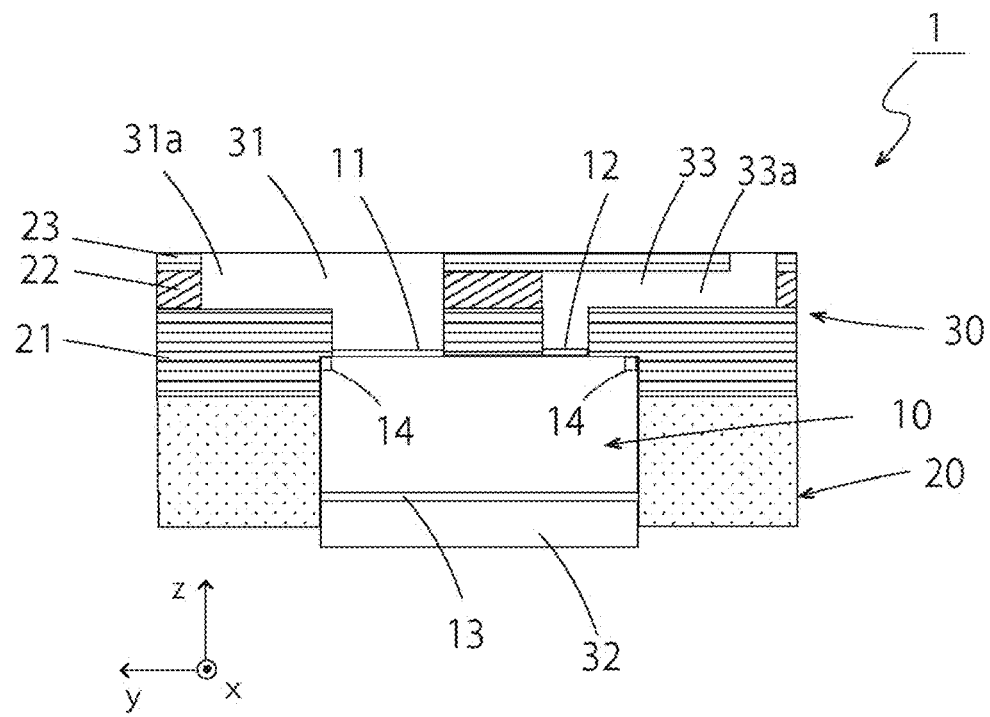
FIG. 1 is a cross-sectional view showing the overview of a power semiconductor device of Embodiment 1 of the present invention.
Figure 2:
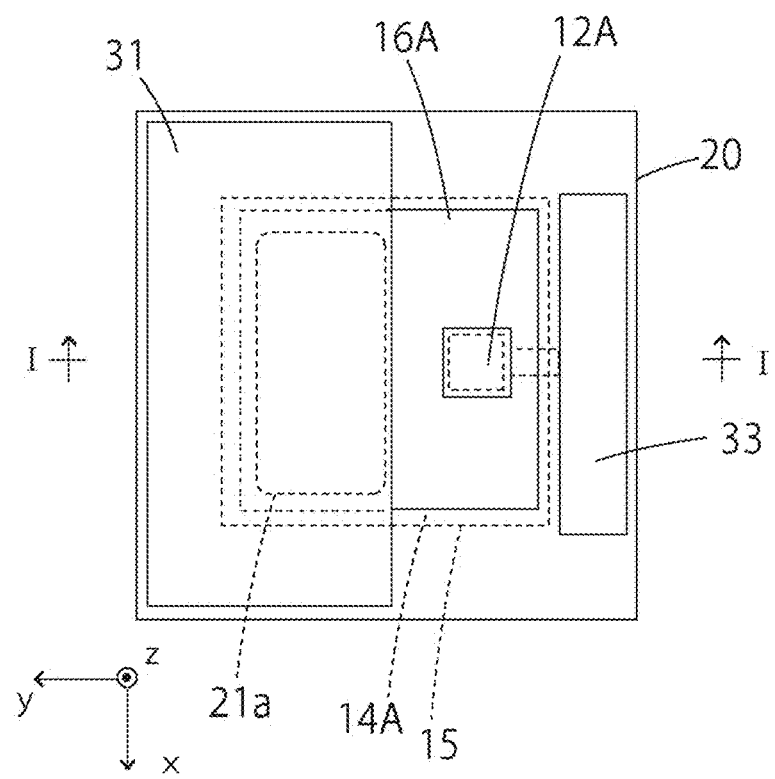
FIG. 2 is a diagram schematically showing a top view of the power semiconductor device of Embodiment 1 of the present invention.

FIG. 1 is a cross-sectional view showing the overview of a power semiconductor device of Embodiment 1 of the present invention. FIG. 2 is a diagram schematically showing a top view of the power semiconductor device of Embodiment 1 of the present invention. The cross-sectional view of FIG. 1 corresponds to a cross-section taken along the line I-I in FIG. 2. In FIG. 1, the horizontal direction on the paper is the y direction, the vertical direction is the z direction, and the direction that intersects with both y and z directions is the x direction.

A power semiconductor device 1 according to Embodiment 1 of the present invention includes a power semiconductor chip 10 having a first side (first surface) and a second side (second surface) opposite to each other, an enclosure (securing member) 20 that has a first side (upper side) and a second side (lower side) encloses and secures the side faces of the power semiconductor chip 10, and a multilayer wiring unit 30 disposed on the first side of the power semiconductor chip 10. The power semiconductor chip 10 includes a first electrode 11 and a second electrode 12 on the first surface, and a third electrode 13 on a surface (second surface) on the opposite side of the first surface. Here the first surface means one of the top surface and the bottom surface of the power semiconductor chip 10, and the second surface means the surface on the opposite side of the first surface. A top view means looking at the first surface having the first electrode 11 and the second electrode 12 in the power semiconductor chip in the direction going from the first surface toward the second surface. This definition applies to other embodiments as well. "Surface" may also be referred to as "primary surface".

The power semiconductor chip 10 constitutes a part of a vertical power semiconductor device. The vertical power semiconductor device refers to a power semiconductor device that turns on and off a flow of a large current between the first electrode 11 and the third electrode 13 by electrically controlling the second electrode 12 such as a control through voltage application. The vertical structure is adapted to obtain sufficiently low ON resistance even when a large current is made to flow in the ON state, and to maintain the applied voltage inside the device. That is, in the ON state, electrical charges go through the inverted channel and spread into the entire drifting layer to secure an area for the electric current route, which makes it possible to achieves the low ON resistance, and in the OFF state, the depletion layer extends from the first surface into the drifting layer, which makes it possible to maintain the voltage. The semiconductor device may be either MOSFET (metal-oxide semiconductor field effect transistor) or IGBT (insulated gate bipolar transistor). The first electrode 11, the second electrode 12, and the third electrode 13 respectively correspond to the source electrode, the gate electrode, and the drain electrode of MOSFET, and the emitter electrode, the base electrode, and the collector electrode in IGBT. In the example of MOSFET, the power semiconductor device 1 may be a trench type where the gate insulating layer is formed in a trench and a part of the gate electrode is embedded, or a planer type where the gate insulating layer and the gate electrode are layered.

The power semiconductor chip 10 is manufactured by forming MOSFET, IGBT or the like on a wafer made of a power semiconductor material such as Si, SiC, or GaN through semiconductor processing and cutting the wafer into chips (or die) through dicing. Thus, before dicing, a termination structure 14 is formed at a portion that becomes the outer periphery of each chip. The termination structure is constituted of a guard ring, a field plate, a RESURF structure, or a combination thereof, for example, to mitigate the concentration of electric fields on the first surface.

As illustrated in FIG. 2, in the power semiconductor chip 10, the first surface in a top view is divided into a main cell area 16A where the first electrode 11 (such as a source electrode or emitter electrode, depending on the type of transistor) is formed, a termination area 14A formed between the main cell area 16A and the chip outer periphery 15 and having the termination structure 14, and an area 12A formed between the main cell area 16A and the termination area 14A in such a manner that a part of the main cell area 16A is cut out to accommodate the second electrode 12. In FIG. 2, the area 12A where the second electrode 12 is formed is located substantially in the middle of the main cell area 16A in the x direction, but the present invention is not limited thereto, and the area 12A may be formed at a corner of the main cell area 16A or in the center of the main cell area 16A.

As illustrated in FIGS. 1 and 2, the enclosure 20 is an insulating member that encloses and secures the side faces of the power semiconductor chip 10, and made of a high heat resistant resin such as epoxy resin or maleimide resin that can handle the operation of the power semiconductor at 175 degree C. and above, for example. The enclosure 20 has a first insulating layer 21 formed to cover the almost entire area of the first surface of the power semiconductor chip 10 except for a penetrating hole 21a, and the first insulating layer 21 covers the top surface of the termination structure 14 of the power semiconductor chip 10.

On the first surface of the power semiconductor chip 10 and the enclosure 20, a multilayer wiring part 30 is formed, and this multilayer wiring part 30 constitutes the fourth electrode 31 and the sixth electrode 33. On the other hand, the fifth electrode 32 is formed on the second surface of the power semiconductor chip 10.

The fourth electrode 31 is formed on the first surface of the power semiconductor chip 10 to be electrically connected to the first electrode 11. As illustrated in FIG. 1, the fourth electrode 31 has an overhanging portion 31a that outwardly extends from the outer edge of the power semiconductor chip 10 in the direction parallel to the first surface (x direction and y direction in the figure). The overhanging portion 31a does not overlap with the power semiconductor chip 10 in a top view. The fourth electrode 31 has a part overlapping with the power semiconductor chip 10 in a top view, and through this part, the fourth electrode 31 is electrically connected to the first electrode 11 and heat generated in the junction part in the power semiconductor chip 10 is transferred to the overhanding portion 31a. This makes it possible to efficiently transfer heat generated in the power semiconductor chip 10 to the outside. By using a metal layer (including alloy) instead of a conventional configuration using a wire or lead frame, the cross-sectional area of the part through which current flows and the cross-sectional area of the part involved in heat transfer are made larger than the first electrode 11, which makes it easier to transfer heat to the outside from the power semiconductor device 1.

The fourth electrode 31 is formed not only on the main cell area, but also on a part of the insulating layer 21 on the termination structure 14 by the overhanging portion 31a on the first surface of the power semiconductor chip 10. The fourth electrode 31 can be formed to stride the termination structure 14 by the insulating layer 21, which allows for a higher degree of freedom in designing the shape and dimensions of the fourth electrode 31 in a top view.

The fifth electrode 32 is formed on the second surface of the power semiconductor chip 10 to be electrically connected to the third electrode 13. The fifth electrode 32 overlaps with the power semiconductor chip 10 almost entirely in a top view, and thus, the fifth electrode 32 is electrically connected to the third electrode 13 and heat generated in the junction part of the power semiconductor chip 10 is transferred from the third electrode 13. That is, by using the fourth electrode 31 and the fifth electrode 32, heat generated in the power semiconductor chip 10 can be efficiently transferred out from the upper side and the lower side.

The sixth electrode 33 is formed on the first surface of the power semiconductor chip 10 to be electrically connected to the second electrode 12. As illustrated in FIG. 1, the sixth electrode 33 has an overhanging portion 33a that outwardly extends from the outer edge of the power semiconductor chip 10 in the direction parallel to the first surface (x direction and y direction in the figure). The overhanding portion 33a does not overlap with the power semiconductor chip 10 in a top view. The sixth electrode 33 has a part overlapping with the power semiconductor chip 10 in a top view, and through this part, electrically connects to the second electrode 12. The sixth electrode 33 is formed not only on the main cell area, but also on a part of the insulating layer 21 on the termination structure 14 by the overhanging portion 33a on the first surface of the power semiconductor chip 10. The sixth electrode 33 can be formed to stride the termination structure 14 by the insulating layer 21, which allows for a higher degree of freedom in designing the position, shape, dimensions of an exposed portion of the sixth electrode 33. This exposed portion is included in the overhanging portion 33a.

In Embodiment 1 of the present invention, the fourth electrode 31 is formed on the first insulating layer 21 on the first surface side of the power semiconductor chip 10 and the enclosure 20, and thus has a larger area than that of the main cell area 16A of the power semiconductor chip 10. This makes it possible to efficiently release heat generated in the power semiconductor chip 10 due to conduction between the fourth electrode 31 and the fifth electrode 32 to the outside through the fourth electrode 31 on the first surface that is close to the junction part of the power semiconductor chip 10.

Specifically, if the size of the power semiconductor chip 10 is as small as several mm square (3 mm×3 mm, for example) in a plan view, then the area on the first surface of the power semiconductor chip 10 for securing one end of a wire or a lead frame would be small. On the other hand, as in Embodiment 1 of the present invention, the power semiconductor device 1 may be configured to include an enclosure 20 that surrounds the side faces of the power semiconductor chip 10, and the overhanding portion 34a of the fourth electrode 34 may be formed on the first insulating layer 21 disposed on the enclosure 20 even if the size of the power semiconductor chip 10 is reduced. As a result, in the power semiconductor device 1 of Embodiment 1 of the present invention, the power semiconductor chip 10 has few size restrictions in a plan view.

In a top view, the area of a portion of the fourth electrode 31 located outside the power semiconductor chip 10 is preferably at least 20% of the main cell area 16A of the power semiconductor chip 10, and if this ratio is 50% or more, then the heat dissipation efficiency is significantly improved. The distance between the fourth electrode 31 and the fifth electrode 32 is preferably 500 µm or more. This makes the power semiconductor chip 10 sufficiently thick, which allows for a higher breakdown voltage.

Embodiment 2

Figure 3:
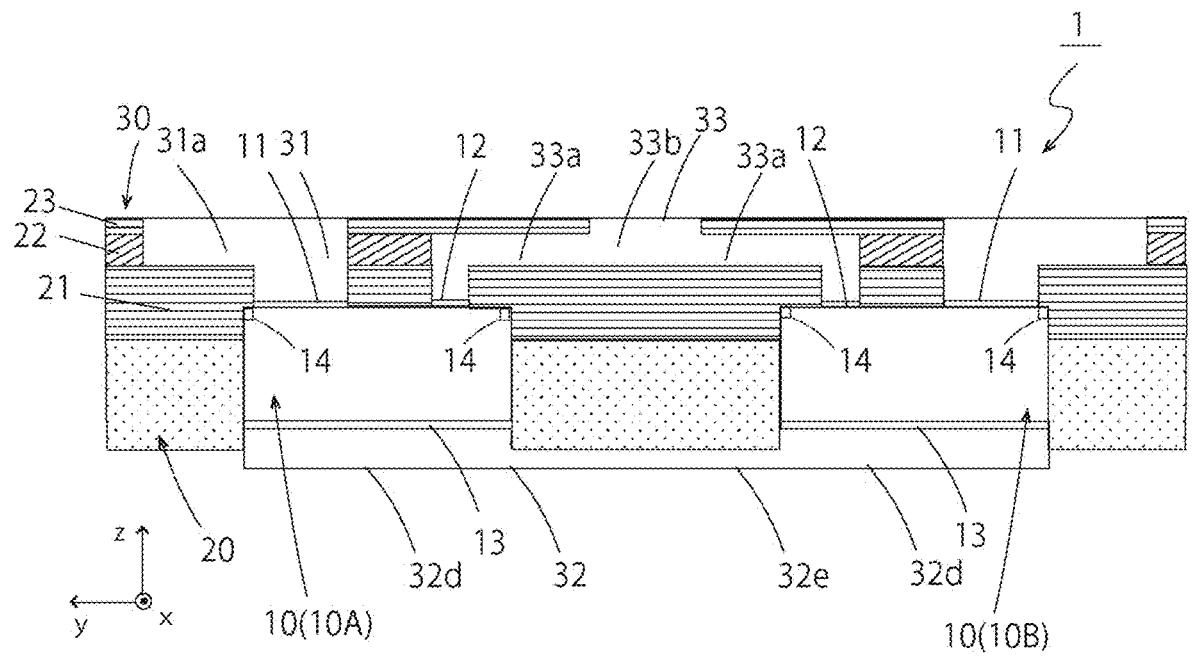
FIG. 3 is a cross-sectional view showing the overview of a power semiconductor device of Embodiment 2 of the present invention.

A power semiconductor device of Embodiment 2 of the present invention will be explained below. FIG. 3 is a cross-sectional view showing the overview of a power semiconductor device 1 of Embodiment 2 of the present invention. In Embodiment 1, the power semiconductor device 1 has one power semiconductor chip 10, but in Embodiment 2, the power semiconductor device 1 has a plurality of power semiconductor chips 10.

The power semiconductor device 1 according to Embodiment 2 includes two power semiconductor chips 10 (10A, 10B) provided at the same height. Each power semiconductor chips 10 includes the first electrode 11 and the second electrode 12 on the first surface, and the third electrode 13 on the second surface.

The fourth electrode 31 is formed on the first surface to be electrically connected to the first electrode 11 of the power semiconductor chip 10A, and to the first electrode 11 of the power semiconductor chip 10B. The fourth electrode 31 has an overhanging portion 31a that outwardly extends from the outer edge of each of the power semiconductor chips 10 (10A and 10B) in the direction parallel to the first surface (at least in the y direction in the figure). The overhanging portion 31a does not overlap with the power semiconductor chip 10 in a top view. The fourth electrode 31 has a part overlapping with the power semiconductor chip 10 (10A and 10B) in a top view, and through this part, the fourth electrode 31 is electrically connected to the first electrodes 11 and heat generated in the junction part in the power semiconductor chip 10 (10A and 10B) is transferred to the overhanding portion 31a. This makes it possible to efficiently transfer heat generated in the power semiconductor chip 10 to the outside. By using a metal layer (including alloy) instead of a conventional configuration using a wire or lead frame, the cross-sectional area of the part through which current flows and the cross-sectional area of the part involved in heat transfer are made larger than the first electrode 11, which makes it easier to transfer heat to the outside from the power semiconductor device 1.

The fourth electrode 31 is formed not only on the main cell area, but also on a part of the insulating layer 21 on the termination structure 14 by the overhanging portion 31a on the first surface of the power semiconductor chip 10 (10A and 10B). The fourth electrode 31 can be formed to stride the termination structure 14 by the insulating layer 21, which allows for a higher degree of freedom in designing the shape and dimensions of the fourth electrode 31 in a top view.

It is preferable that the fourth electrode 31 be commonly formed for the power semiconductor chips 10 (10A and 10B). That is, the fourth electrode 31 may be formed for each of the power semiconductor chips 10A and 10B, but it is more preferable that there be only one electrode provided as the fourth electrode 31.

The fifth electrode 32 is formed on the second surface of the power semiconductor chip 10 (10A and 10B) to be electrically connected to the third electrodes 13. The fifth electrode 32 may be formed for each of the power semiconductor chips 10A and 10B, but it is more preferable that there be only one electrode provided as the fifth electrode 32 as illustrated in FIG. 3. That is, the fifth electrode 32 has portions 32*d* that are electrically connected to the third electrodes 13 of the power semiconductor chips 10 (10A and 10B), and a portion 32*e* that connects the respective portions 32*d* to each other. Electrical conduction and heat transfer between the fifth electrode 32 and the third electrodes 13 are the same as the descriptions of Embodiment 1.

The sixth electrode 33 is formed on the first surface of the power semiconductor chip 10 (10A and 10B) to be electrically connected to the second electrodes 12. The sixth electrode 33 may be formed for each of the power semiconductor chips 10A and 10B, but it is more preferable that there be only one electrode provided as the sixth electrode 33 as illustrated in FIG. 3. That is, the sixth electrode 33 has an overhanding portion 33*a* integrally formed from pieces that respectively extend outwardly from the outer edges of the power semiconductor chips 10 (10A and 10B) in the direction parallel to the first surface (at least in the y direction in the figure). The overhanding portion 33*a* does not overlap with the power semiconductor chip 10 (10A or 10B) in a top view. Electrical conduction between the sixth electrode 33 and the second electrodes 12 is the same as the descriptions of Embodiment 1. The sixth electrode 33 is formed not only on the main cell area, but also on a part of the insulating layer 21 on the termination structure 14 by the overhanging portion 33*a* on the first surface of the power semiconductor chips 10 (10A and 10B). The sixth electrode 33 can be formed to stride the termination structure 14 by the insulating layer 21, which allows for a higher degree of freedom in designing the position, shape, dimensions of an exposed portion of the sixth electrode 33. The sixth electrode 33 overlaps with a part of the enclosure 20 that is present between the power semiconductor chips 10 (10A and 10B) in a top view.

Figure 4:
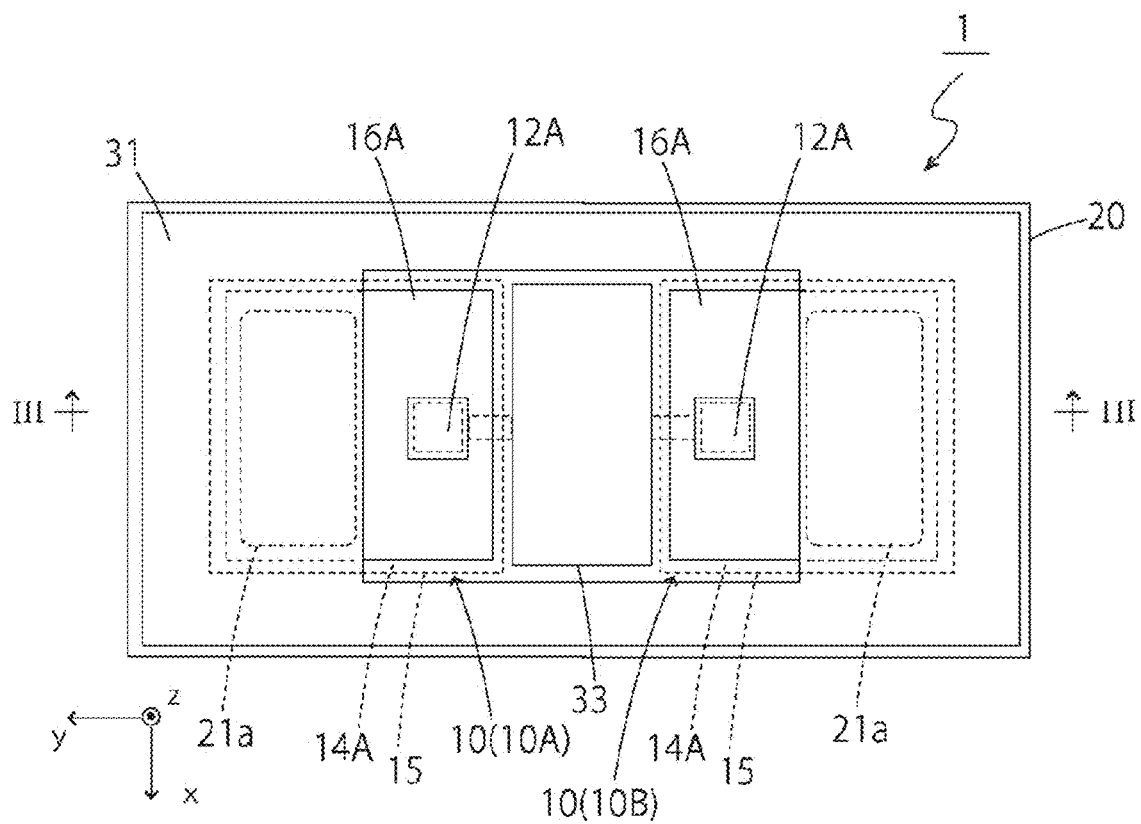
FIG. 4 is a diagram schematically showing a top view of the power semiconductor device of Embodiment 2 of the present invention.
Figure 5:
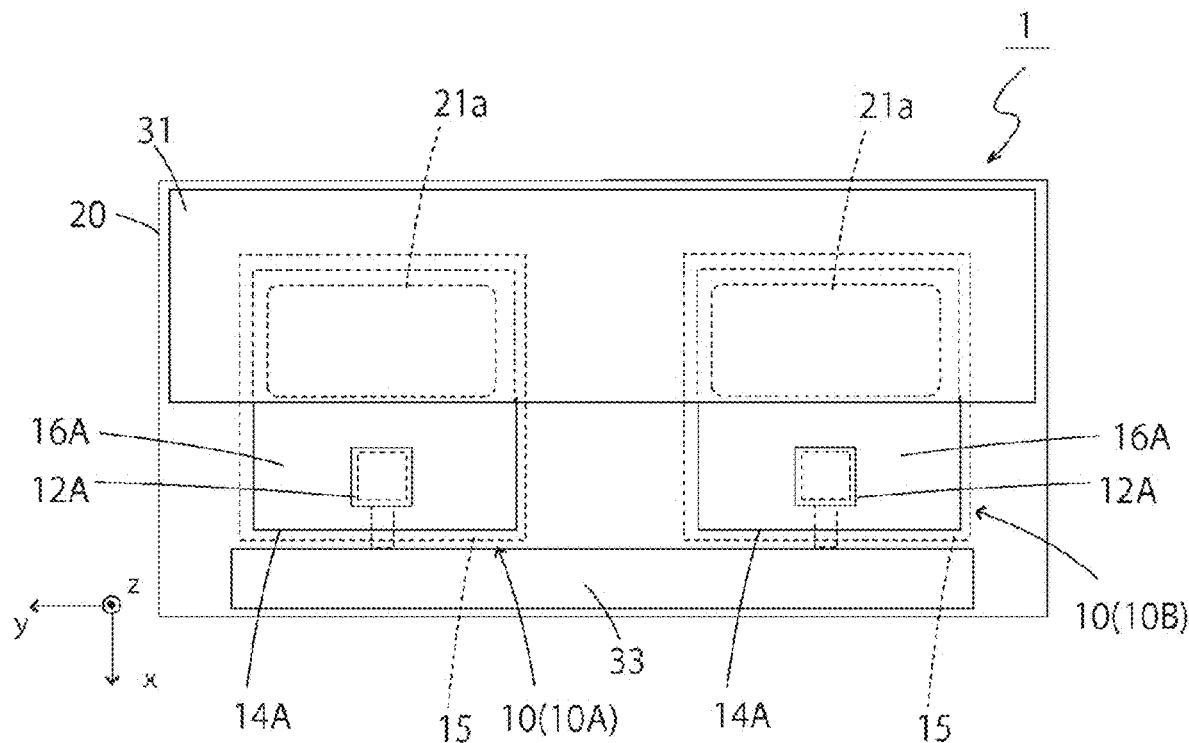
FIG. 5 is a diagram schematically showing a top view of another power semiconductor device of Embodiment 2 of the present invention, differing from FIG. 4.

FIGS. 4 and 5 are schematic diagrams of the top view of the power semiconductor device 1 of Embodiment 2, and illustrates a case in which the power semiconductor device has two power semiconductor chips 10. In the power semiconductor device 1, as illustrated in FIG. 4, the sixth electrode 33 for each of the power semiconductor chips 10 (10A and 10B) has an exposed portion where adjacent sections of the sixth electrode 33 are integrated, and this exposed portion is in a rectangular shape in a top view. In this case, the fourth electrode 31 is a continuous loop shape, or a frame shape, along the outer periphery of the power semiconductor device 1 in a top view, for example. The fourth electrode 31 may alternatively be in a shape having a break instead of the continuous loop shape in a top view so that the rectangular sixth electrode 33 can be taken out. In the power semiconductor device 1, as illustrated in FIG. 5, the fourth electrode 31 of each of the power semiconductor chips 10 (10A and 10B) in a top view is adjacent to each other and integrally formed, and the portion thereof exposed in a top view is in a rectangular shape. In this case, the sixth electrode 33 is formed in parallel with the fourth electrode 31 along an outer edge of the power semiconductor device 1 on the opposite side of the fourth electrode 31 across the areas 12A.

Figure 6:
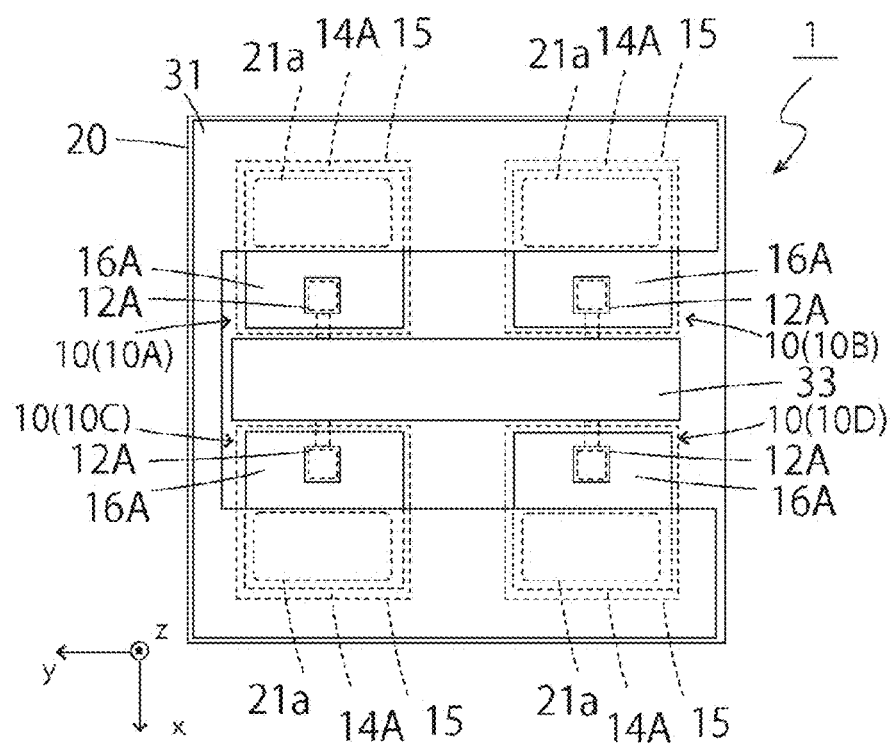
FIG. 6 is a diagram schematically showing a top view of yet another power semiconductor device of Embodiment 2 of the present invention, differing from FIG. 4 or 5.
Figure 7:
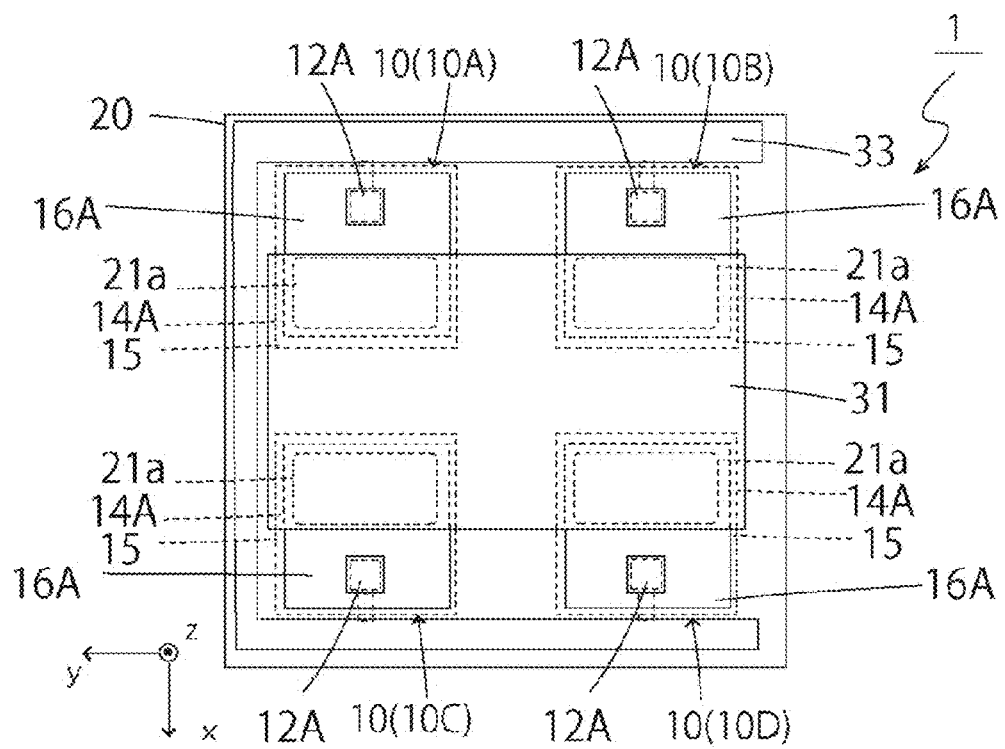
FIG. 7 is a diagram schematically showing a top view of yet another power semiconductor device of Embodiment 2 of the present invention, differing from FIG. 4, 5, or 6.

FIGS. 6 and 7 are schematic diagrams of the top view of the power semiconductor device 1 of Embodiment 2, which differs from that illustrated in FIGS. 4 and 5, and illustrates a case in which the power semiconductor device 1 has four power semiconductor chips 10. In the power semiconductor device 1, as illustrated in FIG. 6, the sixth electrode 33 of each of the power semiconductor chips 10 (10A, 10B, 10C and 10D) in a top view is adjacent to each other and integrally formed, and the portion thereof exposed in a top view is in a rectangular shape. In this case, the fourth electrode 31 is formed in a shape having ends, along the outer periphery of the power semiconductor device 1 in a top view, for example. The fourth electrode 31 is in a shape having ends so that the rectangular sixth electrode 33 can be taken out. In the power semiconductor device 1, as illustrated in FIG. 7, the fourth electrode 31 of each of the power semiconductor chips 10 (10A, 10B, 10C and 10D) in a top view is adjacent to each other and integrally formed, and the portion thereof exposed in a top view is in a rectangular shape. In this case, the sixth electrode 33 is in a shape having ends, along the outer periphery of the power semiconductor device 1 in a top view, for example. The six electrode 33 is in the shape having the ends so that the rectangular fourth electrode 31 may be taken out. The sixth electrode 33 may take a continuous loop shape, utilizing a multilayer structure.

The power semiconductor device 1 of Embodiment 2 is provided with a plurality of power semiconductor chips 10 having the same shape and the same rating, and the respective power semiconductor chips 10 are connected to each other in parallel via the fourth electrode 31, the fifth electrode 32, and the sixth electrode 33, which can make the output as great as the multiples of natural numbers of the rated current. This eliminates the need for designing and manufacturing individual power semiconductor chips for different current ratings and voltage ratings.

As illustrated in FIGS. 4 to 7, the fourth electrode 31 and the sixth electrode 33 may be formed on either the upper or lower surface of the plurality of power semiconductor chips 10 in a rectangular shape (including a square shape), a shape having ends, or a continuous loop shape (ring shape). In addition, the fourth electrode 31 and sixth electrode 33 may have a cut-out portion or penetrating hole therein. This cut-out portion or penetrating hole is formed to prevent separation of the respective metal layers of the electrodes from the power semiconductor chip 10 due to the difference in heat expansion rate between the respective electrodes including the fourth electrode 31 and the sixth electrode 33 and the power semiconductor chip 10 when the power semiconductor device 1 generates heat during operation. In addition to the shape with ends, the fourth electrode 31 and the sixth electrode 33 may be layered to cross over at different heights to form a continuous shape.

Below, the embodiments of the present invention will be explained in further detail.

Embodiment 3

Figure 8:
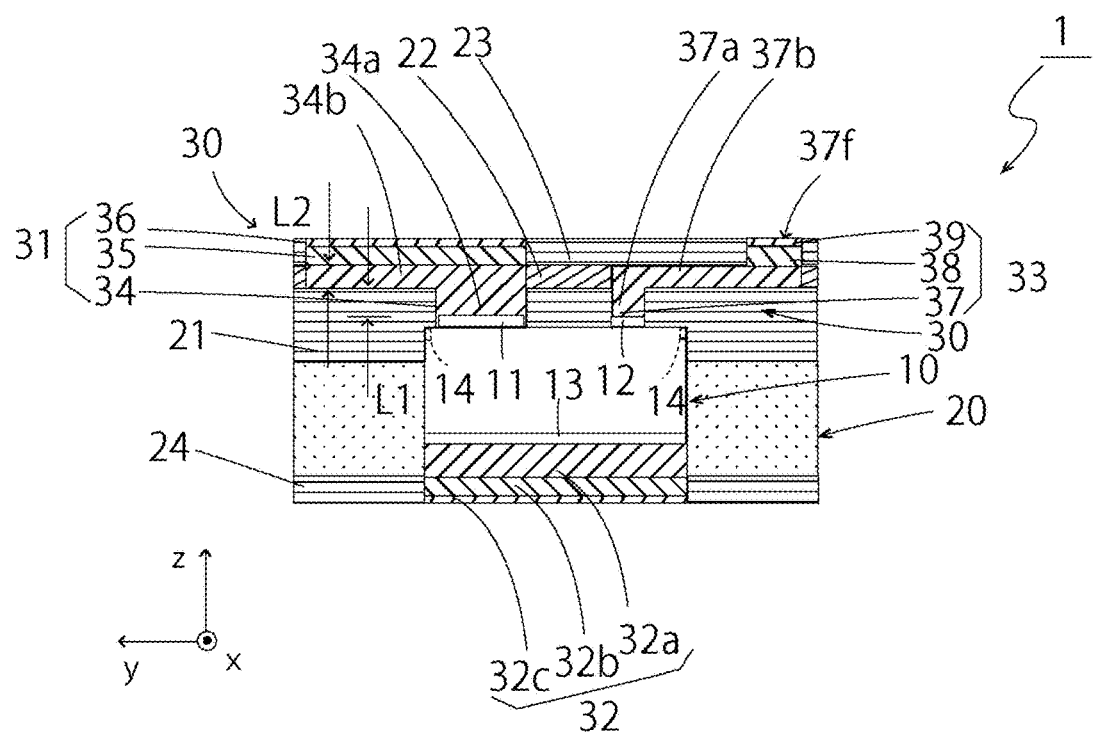
FIG. 8 is a cross-sectional view showing the overview of a power semiconductor device of Embodiment 3 of the present invention.
Figure 9:
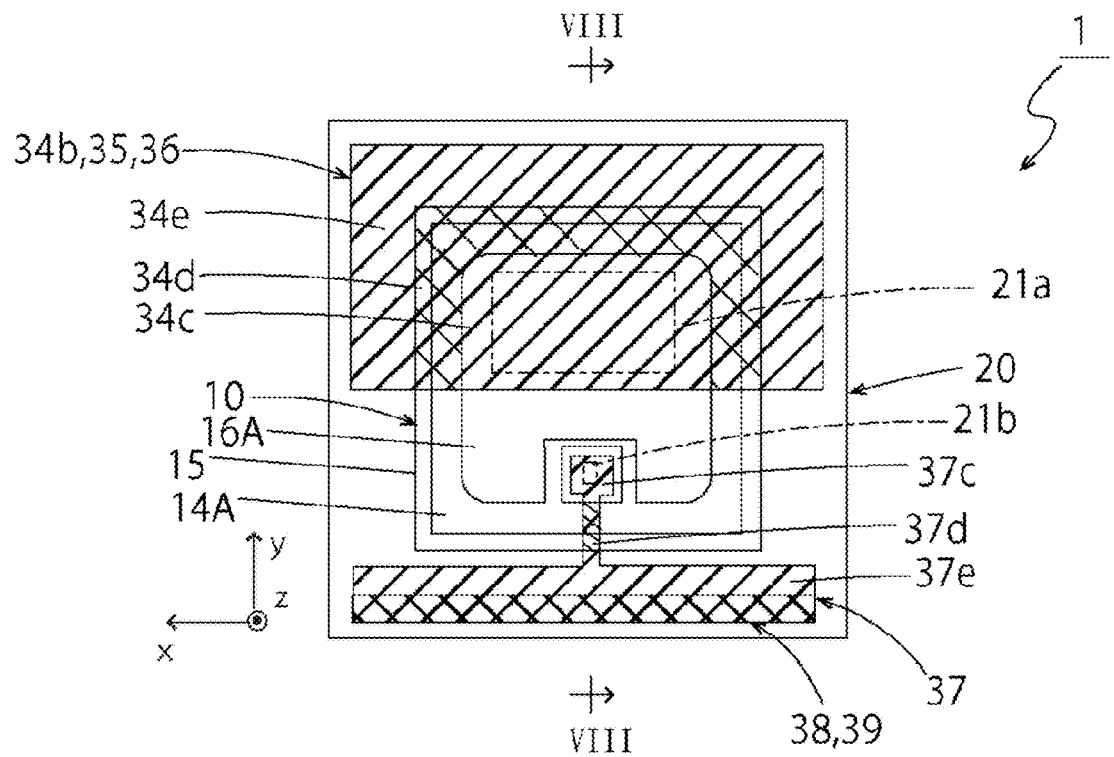
FIG. 9 is a diagram schematically showing the positional relationship between a power semiconductor chip, an enclosure, the first electrode, and the third electrode of the power semiconductor device of Embodiment 3 of the present invention in a top view.

FIG. 8 is a cross-sectional view showing the overview of a power semiconductor device of Embodiment 3. FIG. 9 is a diagram schematically showing the positional relationship between the power semiconductor chip 10, the enclosure 20, the fourth electrode 31, and the sixth electrode 33 in a top view of the power semiconductor device of Embodiment 3 of the present invention. The cross-sectional view of FIG. 8 corresponds to a cross-section taken along the line VIII-VIII in FIG. 9.

A power semiconductor device 1 according to Embodiment 3 of the present invention includes a power semiconductor chip 10, an enclosure (securing member) 20 that encloses and secures the side faces of the power semiconductor chip 10, the fourth electrode 31 and sixth electrode 33 formed on the first surface of the power semiconductor chip 10, and the fifth electrode 32 formed on the second surface of the power semiconductor chip 10. The fourth electrode 31 and the sixth electrode 33 constitute a multilayer wiring part 30. The power semiconductor chip 10 includes a first electrode 11 and a second electrode 12 on the first surface, and a third electrode 13 on the second surface.

Figure 10:
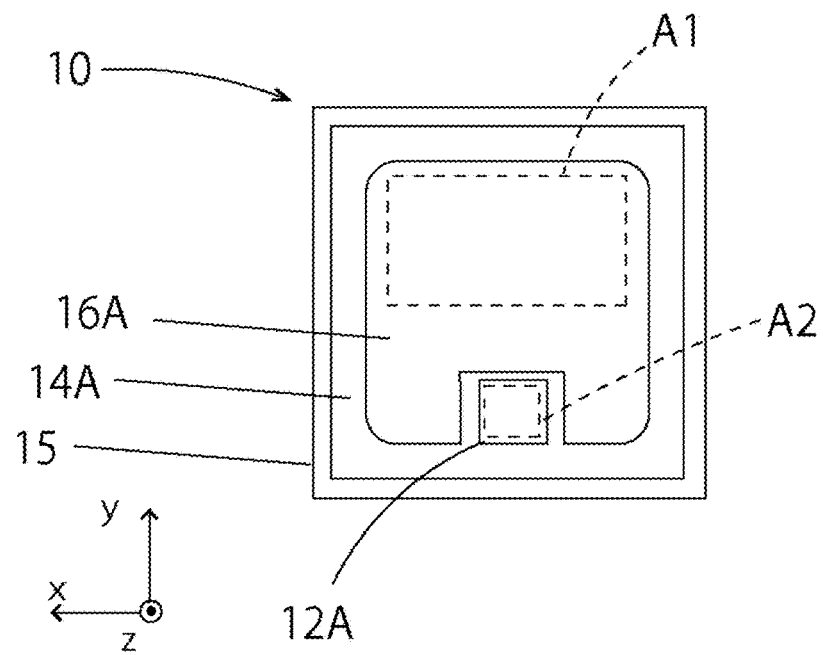
FIG. 10 is a diagram schematically showing a top view of the power semiconductor chip.

FIG. 10 is a diagram schematically showing a top view of the power semiconductor chip 10. As in Embodiment 1, in the power semiconductor chip 10, a part of a vertical power semiconductor device is configured. In the power semiconductor chip 10, the first surface is divided into a main cell area 16A where the first electrode 11 (such as a source electrode or emitter electrode, depending on the type of transistor) is formed, a termination area 14A formed between the main cell area 16A and the chip outer periphery 15 and having the termination structure 14, and an area 12A formed between the main cell area 16A and the termination area 14A in such a manner that a part of the main cell area 16A is cut out to accommodate the second electrode 12. In FIG. 10, the area 12A where the second electrode 12 is formed is located substantially in the middle of the main cell area 16A in the x direction, but the present invention is not limited thereto, and the area 12A may be formed at a corner of the main cell area 16A or in the center of the main cell area 16A.

The enclosure 20 has the same configuration as that of Embodiment 1. On the first surface of the power semiconductor chip 10 and the enclosure 20, a multilayer wiring part 30 is formed, and this multilayer wiring part 30 constitutes the fourth electrode 31 and the sixth electrode 33. On the other hand, the fifth electrode 32 is formed on the second surface of the power semiconductor chip 10.

The fourth electrode 31 is formed on the first surface of the power semiconductor chip 10. The fourth electrode 31 may be constituted of a single metal layer or a plurality of metal layers. As illustrated in FIG. 8, the fourth electrode 31 has a multilayer structure of a first metal layer 34, a second metal layer 35 and a third metal layer 36. The first metal layer 34 is configured such that a portion thereof is formed inside the through hole 21a (see FIG. 9) of the first insulating layer 21 and electrically connects to the first electrode 11, covering a part of the first insulating layer 21. The second metal layer 35 is formed on the first metal layer 34 on the side not facing the power semiconductor chip 10. The third metal layer 36 formed on the second metal layer 35 on the side not facing the power semiconductor chip 10. The number of laminated metal layers may be two, three, or four, but it is preferable to have a smaller number of layers to reduce the number of process steps involved. Since the first metal layer 34 to the third metal layer 36 have the same shape when viewed from above, the heat dissipation efficiency is improved as described later.

As illustrated in FIG. 9, the first metal layer 34 of the fourth electrode 31 is formed inside the through hole 21a of the first insulating layer 21a, above the through hole 21a of the first insulating layer 21, and on a part the termination structure 14 and a part of the enclosure 20 of the power semiconductor chip 10. That is, as illustrated in FIG. 8, the first electrode 11 has an embedded portion 34a formed in the through hole 21a of the first insulating layer 21 such that the bottom face thereof is electrically connected to the first electrode 11, and an extending portion 34b that extends along the plane from the top end of the embedded portion 34a. Of the extending portion 34b, a portion 34c that overlaps the main cell area 16A in a top view, a portion 34d that overlaps an area from the termination area 14A to the chip outer periphery 15 in a top view, and a portion 34c (will specifically be referred to as an overhanging portion) that extends from the outer periphery 15 of the power semiconductor chip 10 and overlaps the enclosure 20 are included in the fourth electrode 31. Here, the embedded portion 34a is constituted of the first metal layer 34, and the extending portion 34b is formed of the first metal layer 34, the second metal layer 35, and the third metal layer 36.

The first metal layer 34 is made of a metal material having a high heat dissipation rate such as a Cu layer, an Al layer, or an alloy layer containing Cu or Al. The lower limit of the thickness L2 of the extending portion 34b of the first metal layer 34 is determined by the electrical conduction capacity, and the upper limit thereof is determined such that stress is not generated in the first metal layer 34 due to the difference in heat expansion coefficient between the power semiconductor chip 10 and the first metal layer 34. It is preferable that the thickness L2 be at least 10 μm but no greater than 150 μm. Depth L1 of the through hole 21a (embedded portion 34a) of the insulating layer 21 is determined in relation to the insulating layer 21 and the like, and preferably at least 5 μm but no greater than 20 μm.

The second metal layer 35 is constituted of a metal material such as an Ni layer, for example, and the third metal layer 36 is constituted of a metal material such as Au, for example. The second metal layer 35 is approximately 6 μm, for example, and the third metal layer 36 is approximately 50 μm, for example. The second metal layer 35 is provided to prevent a bonding layer formed on the third metal layer 36 at the side not facing the second metal layer 35 from being weaker due to diffusion of components of the first metal layer 34 and the like. The third metal layer 36 is provided to prevent oxidation of the second metal layer 35.

As illustrated in FIG. 8, the fifth electrode 32 is formed on the second surface of the power semiconductor chip 10. The fifth electrode 32 may be constituted of a single metal layer or a plurality of metal layers. The fifth electrode 32 has the following multilayer structure: a first metal layer 32a formed on the third electrode 13 of the power semiconductor chip 10 and flush with the second surface of the enclosure 20; a second metal layer 32b formed on the first metal layer 32a on the side not facing the power semiconductor chip 10; and a third metal layer 32c formed on the second metal layer 32b on the side not facing the power semiconductor chip 10. The second metal layer 32b and the third metal layer 32c are layered in this order from top to bottom (toward the −z direction), going beyond the enclosure 20 toward the rear surface (−z) direction. The number of metal layers constituting the fifth electrode 32 may be three as illustrated in the figure, or any other number such as two or four. The first metal layer 32a, the second metal layer 32b, and the third metal layer 32c are defined by the size of the power semiconductor chip 10 as illustrated in the figure, and the dimensions thereof are within the same range as each other, except for the dimension in the thickness direction.

The first metal layer 32a is made of a metal material having a high thermal conductivity such as a Cu layer, an Al layer, or an alloy layer containing Cu or Al. The thickness of the first metal layer 32a is preferably 5 μm or greater, and more preferably 10 μm or greater. When the thickness is within this range, heat is sufficiently dissipated. The thickness of the first metal layer 32a is set so that the first metal layer 32a does not have too much stress from the difference in heat expansion coefficient between the power semiconductor chip 10 and the first metal layer 32a.

The second metal layer 32b is constituted of a metal material such as an Ni layer, for example, and the third metal layer 32c is constituted of a metal material such as Au, for example. The second metal layer 32b is approximately 6 μm, for example, and the third metal layer 32c is approximately 50 μm, for example. The second metal layer 32b is provided to prevent a bonding layer formed below the third metal layer 32c on the side not facing the second metal layer 32b from being weaker due to diffusion of components of the first metal layer 32a and the like. The third metal layer 32c is provided to prevent oxidation of the second metal layer 32b.

The sixth electrode 33 is formed as a part of the multilayer wiring part 30 on the first surface of the power semiconductor chip 10 and the enclosure 20 not to overlap with the fourth electrode 31 in a top view. The sixth electrode 33 is formed on the first surface of the power semiconductor chip 10. The sixth electrode 33 may be constituted of a single metal layer or a plurality of metal layers. As illustrated in FIG. 8, the sixth electrode 33 has a multilayer structure of a first metal layer 37, a second metal layer 38 and a third metal layer 39. The first metal layer 37 is configured such that a portion thereof is formed inside the through hole 21b (see FIG. 9) of the first insulating layer 21 and is electrically connected to the second electrode 12, covering a part of the first insulating layer 21. The second metal layer 38 formed on the first metal layer 37 on the side not facing the power semiconductor chip 10. The third metal layer 39 is formed on the second metal layer 38 on the side not facing the power semiconductor chip 10. The number of laminated metal layers may be two, three, or four, but it is preferable to have a smaller number of layers to reduce the number of process steps involved.

As illustrated in FIG. 9, the first metal layer 37 of the sixth electrode 33 is formed inside the through hole 21b of the first insulating layer 21, above the through hole 21b, and on a part of the termination structure 14 and enclosure 20 of the power semiconductor chip 10. That is, as illustrated in FIG. 8, the sixth electrode 33 has an embedded portion 37a formed in the through hole 21b of the first insulating layer 21 such that the bottom face thereof is electrically connected to the second electrode 12, an extending portion 37b that extends along the plane from the top end of the embedded portion 37a, and a connecting portion 37f connected to the extending portion 37b at a distance from the fourth electrode 31 and deposited toward the direction opposite from the embedded portion 37a. Of the extending portion 37b, a portion 37c that overlaps the area 12A where the gate electrode is formed in a top view, a portion 37d that overlaps an area from the termination area 14A to the chip outer periphery 15 in a top view, and a portion 37e (will specifically be referred to as an overhanging portion) that extends from the outer periphery 15 of the power semiconductor chip 10 and overlaps the enclosure 20 are included in the sixth electrode 33. Here, the embedded portion 37a and the extending portion 37b are formed of the first metal layer 37, and the connecting portion 37f is formed of the second metal layer 38 and the third metal layer 39.

The first metal layer 37, the second metal layer 38, and the third metal layer 39 constituting the sixth electrode 33 are preferably made of the same material and into the same thickness as those of the first metal layer 34, the second metal layer 35, and the third metal layer 36 constituting the fourth electrode 31.

On the first surface of the power semiconductor chip 10, the first insulating layer 21, the second insulating layer 22, and the third insulating layer 23 are formed in this order. The dimension of the first insulating layer 21 is the same as a dimension from the top surface of the enclosure 20 to the bottom surface of the extending portion 34b of the first metal layer 34 of the fourth electrode 31, or in other words, a dimension from the top surface of the enclosure 20 to the bottom surface of the extending portion 37b of the first metal layer 37 of the sixth electrode 33. The second insulating layer 22 has the same thickness as the extending portion 34b of the first metal layer 34 of the fourth electrode 31 and the extending portion 37b of the first metal layer 37 of the sixth electrode 33. The thickness of the third insulating layer 23 is the same as the sum of the thicknesses of the second metal layer 35 and the third metal layer 36 of the fourth electrode 31, or in other words, the sum of the thicknesses of the second metal layer 38 and the third metal layer 39 of the sixth electrode 33. That is, the third metal layer 36 that is the outermost layer of the fourth electrode 31 and the third metal layer 39 that is the outermost layer of the sixth electrode 33 are at the same level and flush with each other due to the multilayer structure of the first insulating layer 21, the second insulating layer 22, and the third insulating layer 23. This makes it possible to keep the fourth electrode 31 and the sixth electrode 33, which are formed on the first surface of the power semiconductor chip 10 from touching each other.

On the second surface of the enclosure 20, a fourth insulating layer 24 is formed to surround the second metal layer 32b and the third metal layer 32c.

In Embodiment 3 of the present invention as well, the fourth electrode 31 is formed on the first insulating layer 21 on the first surface side of the power semiconductor chip 10 and the enclosure 20, and thus has a larger area than that of the main cell area 16A of the power semiconductor chip 10. This makes it possible to efficiently release heat generated in the power semiconductor chip 10 due to conduction between the fourth electrode 31 and the fifth electrode 32 to the outside through the fourth electrode 31 on the first surface that is close to the junction part of the power semiconductor chip 10.

When a power semiconductor chip is connected to an external terminal using a wire as in the conventional technique, just a small part of the main cell area 16A can be used for securing one end of the wire (Area Al of FIG. 10), which increases the current density in the wire. When connecting an external terminal and a power semiconductor chip with a lead frame, it is necessary to dispose the lead frame above the power semiconductor chip so as not to touch the termination structure of the power semiconductor chip, and thus, only a small area of the power semiconductor chip can be allocated for securing one end of the lead frame. Because it is not possible to place a component for heat transfer above the lead frame in that area, the lead frame would have a high current density as the current density depends on the size of the cross section that is perpendicular to the current flowing direction of the lead frame.

In contrast to these conventional techniques, in Embodiment 3 of the present invention, the fourth electrode 31 has the overhanging portion 34e outside the power semiconductor chip 10, so that the extending portion 34b of the fourth electrode 31 has a greater area in a top view, and by placing a metal plate (denoted with the reference character 41 in FIG. 13, and 135b in FIG. 20A) above the extending portion 34b, heat can be released to the outside via the second metal layer 35 and the third metal layer 36 as described below. Also, by increasing the area of the cross section that intersects with the thickness direction of the fourth electrode 31, the current density of the fourth electrode 31 can be reduced.

Furthermore, in Embodiment 3 of the present invention, the sixth electrode 33 has the overhanging portion 37e outside the power semiconductor chip 10, and the connecting portion 37f is provided at one end of the overhanging portion 37e above the enclosure 20. This eliminates the need for connecting one end of the wire in the area 12A where the gate electrode of the power semiconductor chip 10 is placed as in FIG. 10. That is, in Embodiment 3 of the present invention, because the overhanging portion 37e is formed outside the power semiconductor chip 10 so as to overlap with the enclosure 20 in a top view, and can be widened in a direction intersecting the direction in which the extending portion 37b extends from the embedded portion 34a in the through hole 21b, the degree of freedom in design is improved.

Embodiment 4

Figure 11:
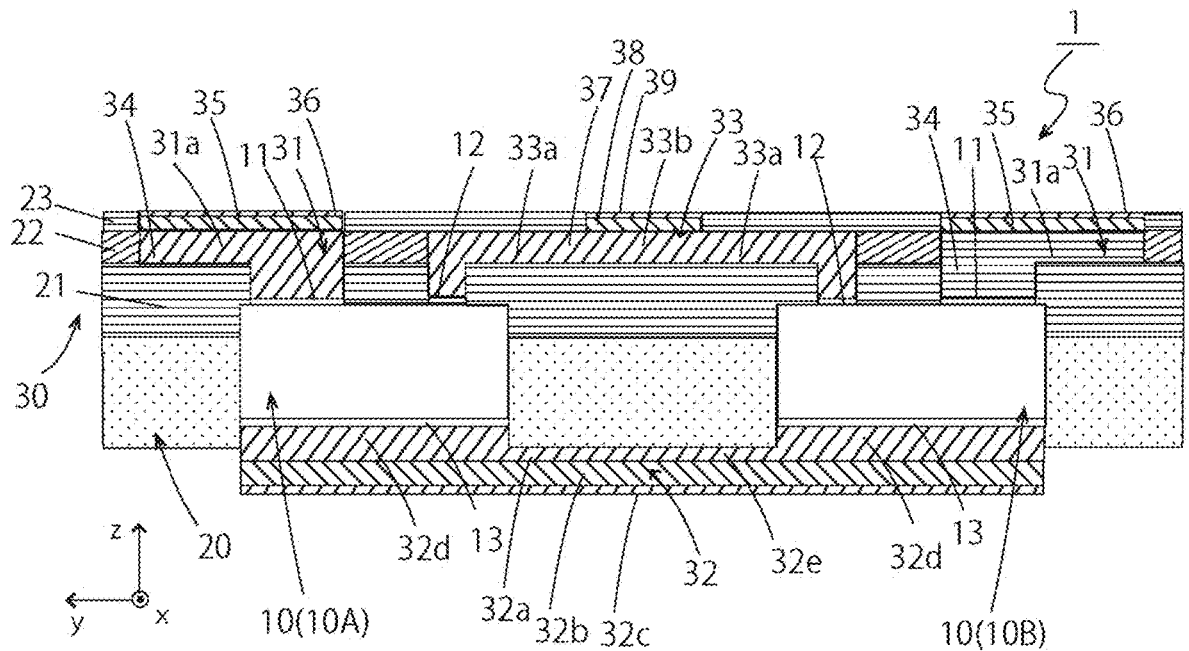
FIG. 11 is a cross-sectional view showing the overview of a power semiconductor device of Embodiment 4 of the present invention.

FIG. 11 is a cross-sectional view showing the overview of a power semiconductor device 1 of Embodiment 4 of the present invention. Embodiment 4 embodies the fourth electrode 31, the fifth electrode 32, and the sixth electrode 33 in Embodiment 2. Components in common with or corresponding to FIG. 3 are assigned the same reference characters and descriptions thereof will be omitted.

As illustrated in FIG. 11, for example, the fourth electrode 31 has a multilayer structure of the first metal layer 34, the second metal layer 35 and the third metal layer 36. The configurations of the first metal layer 34, the second metal layer 35 and the third metal layer 36 are the same as those in Embodiment 3.

As illustrated in FIG. 11, for example, the fifth electrode 32 has a multilayer structure of the first metal layer 32a, the second metal layer 32b, and the third metal layer 32c. The configurations of the first metal layer 32a, the second metal layer 32b, and the third metal layer 32c are the same as those in Embodiment 3.

As illustrated in FIG. 11, for example, the sixth electrode 33 has a multilayer structure of the first metal layer 37, the second metal layer 38 and the third metal layer 39. The configurations of the first metal layer 37, the second metal layer 38 and the third metal layer 39 are the same as those in Embodiment 3.

Embodiment 5

Figure 12:
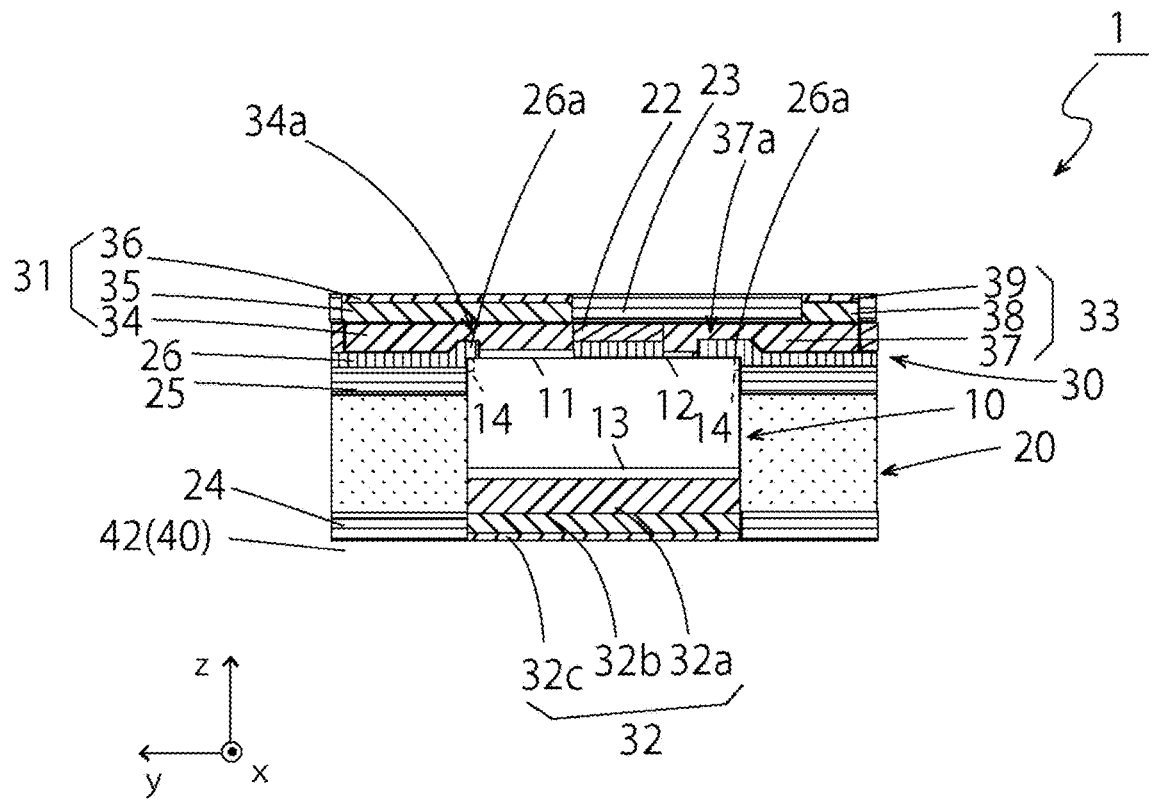
FIG. 12 is a cross-sectional view showing the overview of a power semiconductor module of Embodiment 5 of the present invention.

FIG. 12 is a cross-sectional view showing the overview of a power semiconductor device 1 of Embodiment 5 of the present invention. Components in common with or corresponding to those of the power semiconductor device 1 illustrated in FIG. 8 are assigned the same reference characters.

The power semiconductor device 1 of Embodiment 5 of the present invention differs from that of Embodiment 4 in the following configuration: in the power semiconductor device 1 of Embodiment 5, the top surface of a first insulating layer 25 does not reach the top surface of the power semiconductor chip 10, and the first insulating layer 25 is thinner than the first insulating layer 21 of FIG. 8. A fourth insulating layer 26 is formed between the first insulating layer 25 and the second insulating layer 22, and this fourth insulating layer 26 overlaps with the periphery of the power semiconductor chip 10 in a top view. In this overlapping portion 34a, the first metal layer 34 of the fourth electrode 31 is thinner than the other portions. Also, the first metal layer 37 of the sixth electrode 33 is thinner in this overlapping portion 37a compared to the other portions.

This configuration makes the power semiconductor device 1 of Embodiment 5 of the present invention thinner than the power semiconductor device 1 of Embodiment 4.

Embodiment 6

In Embodiment 6 of the present invention, the power semiconductor device 1 of Embodiments 1 to 5 further includes a plurality of metal plates 40 that each act as an external terminal. The power semiconductor device 1 o Embodiment 6 also includes a cooling part 55 including a cooling unit as necessary.

Figure 13:
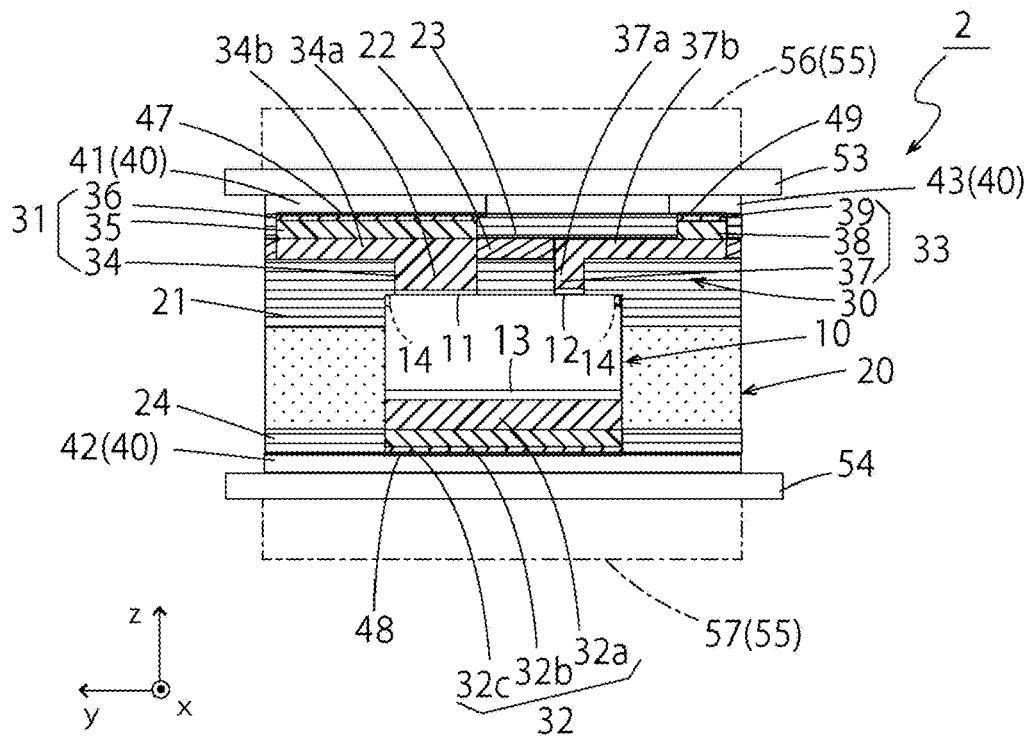
FIG. 13 is a cross-sectional view showing the overview of a power semiconductor module of Embodiment 6 of the present invention.

FIG. 13 is a cross-sectional view of a power semiconductor module 2 of Embodiment 6 of the present invention. FIG. 13 illustrates a power semiconductor device including both the plurality of metal plates 40 and the cooling part 55 as opposed to the power semiconductor device 1 of Embodiment 3. This also applies to the power semiconductor device of other embodiments described above.

In the power semiconductor device 1 of Embodiments 1 to 5, the power semiconductor chip 10 and the respective electrodes provided on the upper and lower surfaces of the power semiconductor chip 10 are in contact with the metal plates 40 provided on the upper and lower surfaces of the respective electrodes in a corresponding manner. The power semiconductor device 1 has at least three electrodes, and thus, three metal plates 41, 42, and 43 are used. The first metal plate 41 is provided on the outermost metal layer of the fourth electrode 31 (the third metal layer 36 in FIG. 13) via solder or a bonding material 47 as necessary. The second metal plate 42 is provided on the lower surface of the outermost metal layer of the fifth electrode 32 (the third metal layer 32c in FIG. 13) via solder or a bonding material 48 as necessary. The third metal plate 43 is provided on the outermost metal layer of the sixth electrode 33 (the third metal layer 39 in FIG. 13) via solder or a bonding material 49 as necessary. For the metal plates 40 (41, 42, and 43), a metal plate with high heat conductivity such as a copper plate is used. Those metal plates 40 each have a shape of an external terminal, and are electrically connected to an external component.

The first metal plate 41 and the third metal plate 43 are placed on the lower surface of a ceramic plate 53, and the second metal plate 42 is placed on the upper surface of a ceramic plate 54. A cooling part 56 is provided on the upper surface of the ceramic plate 53 with grease interposed therebetween, and a cooling part 57 is provided on the lower surface of the ceramic plate 54 with grease interposed therebetween. The upper and lower cooling parts 55 (56 and 57) are configured such that cooling water flows therein via a water channel (not shown). The ceramic plates 53 and 54 are made of a material such as silicon nitride (SiN) or aluminum nitride (AlN).

Embodiment 7

Figure 14:
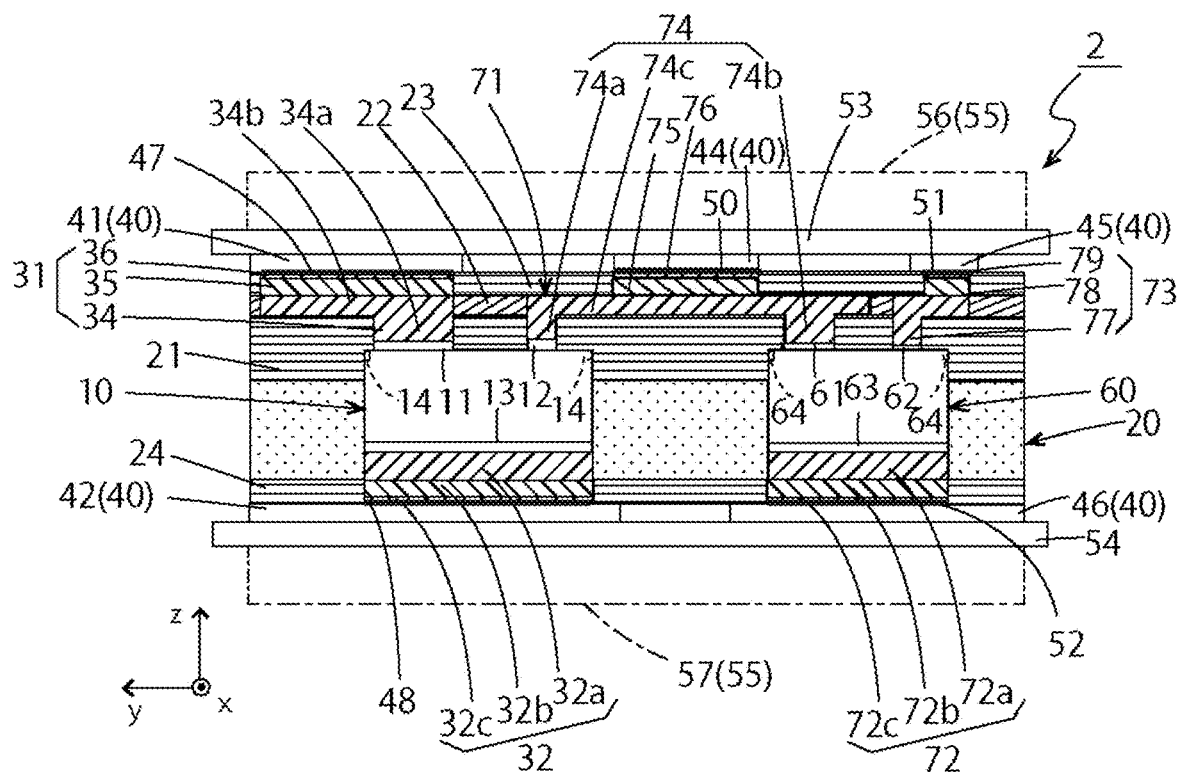
FIG. 14 is a cross-sectional view showing the overview of a power semiconductor module of Embodiment 7 of the present invention.

FIG. 14 is a cross-sectional view showing the overview of a power semiconductor module 2 of Embodiment 7 of the present invention. Components in common with or corresponding to those of the power semiconductor device 1 illustrated in FIG. 8 are assigned the same reference characters. The power semiconductor module 2 of Embodiment 7 of the present invention is a module that combines the power semiconductor chip 10 with a driving chip 60 that applies voltage to the second electrode 12 of the power semiconductor chip 10 to drive the power semiconductor chip 10.

The driving chip 60 is a vertical semiconductor device similar to the power semiconductor chip 10 where a first electrode 61 and a second electrode 62 are formed on the first surface, a third electrode 63 is formed on the second surface, and the first electrode 61 and the third electrode 63 are electrically connected and disconnected with each other by applying voltage to the second electrode 62 and the like. The first surface of the driving chip 60 is flush with the first surface of the power semiconductor chip 10, and the manufacturing process for the power semiconductor chip 10 and for the driving chip 60 is performed at the same time on the first surface of the power semiconductor module 2. On the lower surface (the surface in the −z direction) of the third electrode 63 of the driving chip 60, a fifth electrode 72 having a multilayer structure of a first metal layer 72a, a second metal layer 72b, and a third metal layer 72c is formed in a manner similar to the power semiconductor chip 10. The multilayer structure of the first metal layer 72a, the second metal layer 72b, and the third metal layer 72c is made of the same material and has the same thickness as the first metal layer 32a, the second metal layer 32b, and the third metal layer 32c constituting the fifth electrode 32 of the power semiconductor chip 10.

A connecting electrode 71 is formed on the first surface of the power semiconductor chip 10, the driving chip 60, and the enclosure 20 to connect the second electrode 12 of the power semiconductor chip 10 with the first electrode 61 of the driving 60. The connecting electrode 71 is configured to include a first metal layer 74 having an embedded portion 74a, an embedded portion 74b, and an extending portion 74c, a second metal layer 75 formed to be in contact with part of the extending portion 74c of the first metal layer 74, and a third metal layer 76 formed on the second metal layer 75. The embedded portion 74a and the embedded portion 74b are respectively formed in the through holes of the first insulating layer 21 provided on the second electrode 12 of the power semiconductor chip 10 and the first electrode 61 of the driving chip 60. With this configuration, the termination structure 14 of the power semiconductor chip 10 and a termination structure 64 of the driving chip 60 are covered with the first insulating layer 21, which allows for a greater degree of freedom in wiring, in a manner similar to the overhanging portion 37e in Embodiment 3. The extending portion 74c extends from the top end of the embedded portion 74a and the embedded portion 74b in the direction along which at least the power semiconductor chip 10 and the driving chip 60 are arranged. The second metal layer 75 and the third metal layer 76 are disposed in substantially the middle of the embedded portion 74a and the embedded portion 74b, and do not overlap with the embedded portions 74a and 74b in a top view.

On the first surface of the driving chip 60 and the enclosure 20, a sixth electrode 73 for the second electrode 62 is provided. As illustrated in FIG. 14, the sixth electrode 73 has a multilayer structure of a first metal layer 77, a second metal layer 78 and a third metal layer 79. The first metal layer 77 is configured such that a portion thereof is formed inside the through hole of the first insulating layer 21 and is electrically connected to the second electrode 62, covering a part of the first insulating layer 21. The second metal layer 78 is formed on the first metal layer 77 on the side not facing the driving chip 60. The third metal layer 79 is formed on the second metal layer 78 on the side not facing the driving chip 60.

The first metal layer 74 of the connecting electrode 71 and the first metal layer 77 of the sixth electrode 73 on the driving chip 60 are made of the same material and have the same thickness as the first metal layer 34 of the fourth electrode 31 on the power semiconductor chip 10. The second metal layer 75 of the connecting electrode 71 and the second metal layer 78 of the sixth electrode 73 on the driving chip 60 are made of the same material and have the same thickness as the second metal layer 35 of the fourth electrode 31 on the power semiconductor chip 10. The third metal layer 76 of the connecting electrode 71 and the third metal layer 79 of the fifth electrode 73 on the driving chip 60 are made of the same material and have the same thickness as the third metal layer 36 of the fourth electrode 31 on the power semiconductor chip 10.

In Embodiment 7, the metal plates 40 are constituted of a first metal plate 41 connected to the fourth electrode 31 on the first surface of the power semiconductor chip 10 via solder or a bonding material 47 as necessary, a second metal plate 42 connected to the fifth electrode 32 on the second surface of the power semiconductor chip 10 via solder or a bonding material 48 as necessary, a third metal plate 44 connected to the connecting electrode 71 via solder or a bonding material 50 as necessary, a fifth metal plate 45 connected to the fifth electrode 73 on the first surface of the driving chip 60 via solder or a bonding material 51 as necessary, and a fourth metal plate 46 connected to the fifth electrode 72 on the second surface of the driving chip 60 via solder or a bonding material 52.

As illustrated in FIG. 14, in the power semiconductor module 2 of Embodiment 7, the power semiconductor chip 10 and the driving chip 60 have substantially the same thickness, and the wiring structure above and below the respective chips are made of the same material and have the same thickness as each other. This way, the respective chips can be made into a module efficiently. The power semiconductor module 2 employs the structure of the power semiconductor device 1 of Embodiments 1, 3 and the like, and thus achieve the same effects.

Embodiment 8

Figure 15:
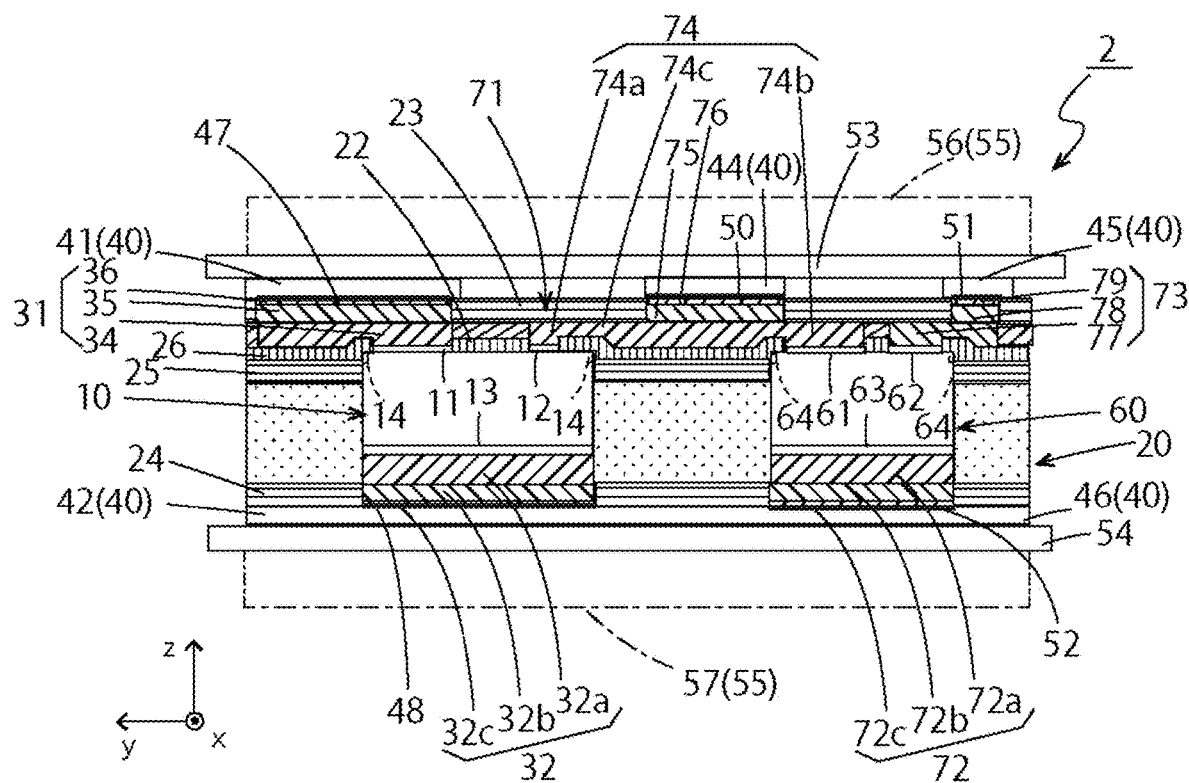
FIG. 15 is a cross-sectional view showing the overview of a power semiconductor module of Embodiment 8 of the present invention.

FIG. 15 is a cross-sectional view showing the overview of a power semiconductor module 2 of Embodiment 8 of the present invention. Components in common with or corresponding to those of the power semiconductor device 1 illustrated in FIG. 12 and the power semiconductor module 2 illustrated in FIG. 14 are assigned the same reference characters. The power semiconductor module 2 of Embodiment 8 of the present invention is a module that combines a power semiconductor chip 10 with a driving chip 60 that drives the power semiconductor chip 10 by energizing the second electrode 12 of the power semiconductor chip 10.

In Embodiment 8, the first insulating layer 25 and the fourth insulating layer 26 are provided instead of the first insulating layer 21 as in Embodiment 7, and the first metal layer 34 of the fourth electrode and the first metal layer 74 in the connecting electrode 71 of the power semiconductor chip 10, and the first metal layer 77 of the fifth electrode 73 of the driving chip 60 have a different shape.

The power semiconductor module 2 of Embodiment 8 employs the same configuration as the power semiconductor device 1 of Embodiments 5, and also employs the same configuration as the power semiconductor module 2 of Embodiment 7. Thus, it is possible to achieve the same effects as those.

Embodiment 9

Next, as Embodiment 9 of the present invention, a manufacturing method of the power semiconductor device 1 and a manufacturing method of the power semiconductor module 2 will be explained. Below, a manufacturing method of the power semiconductor device 1 illustrated in FIGS. 2 and 11 will be explained. The manufacturing method described below may also be applied to a power semiconductor device 1 having one power semiconductor chip 10 by making appropriate modifications.

FIGS. 16A to 16G are schematic cross-sectional views for explaining the manufacturing method of the power semiconductor module 2 of Embodiment 9 of the present invention in an appropriate order. Please note that each diagram of FIGS. 16A to 16G does not represent one process, but may illustrate several processes together.

First, a plurality of power semiconductor chips 10 are prepared. On the second surface of the power semiconductor chip 10, a metal layer 101 made of a metal is formed to be thicker than the first metal layer 32a of the fifth electrode 32.

Figure 16A:
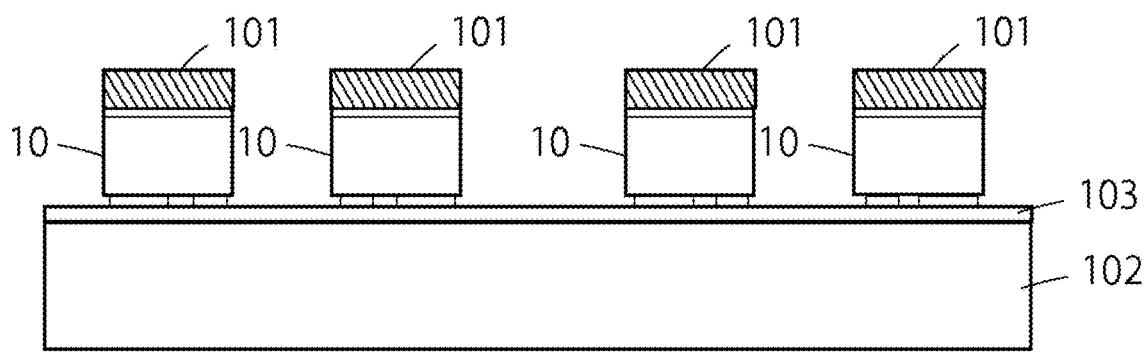
FIG. 16A is a cross-sectional view schematically showing the initial state in a manufacturing method of a power semiconductor module of Embodiment 9 of the present invention.

Next, as illustrated in FIG. 16A, an adhesive sheet 103 is placed on a carrier substrate 102, and the power semiconductor chips 10 are arranged at prescribed intervals. The power semiconductor chips 10 are arranged such that the second surface thereof faces up, and the first electrode and the second electrode on the first surface faces the adhesive sheet 103. The plurality of power semiconductor chips 10 are also arranged such that a pair or set of power semiconductor chips 10 to be made into one power semiconductor device 1 have the first electrodes thereof or the second electrodes thereof placed adjacent to each other, for example.

Next, in the state of FIG. 16A, a resin mold is formed. A mold resin layer 104 is made to be thick enough to mold the respective metal layers 101 on the power semiconductor chips 10. Thereafter, the carrier substrate 102 and the adhesive sheet 103 are removed.

Figure 16B:
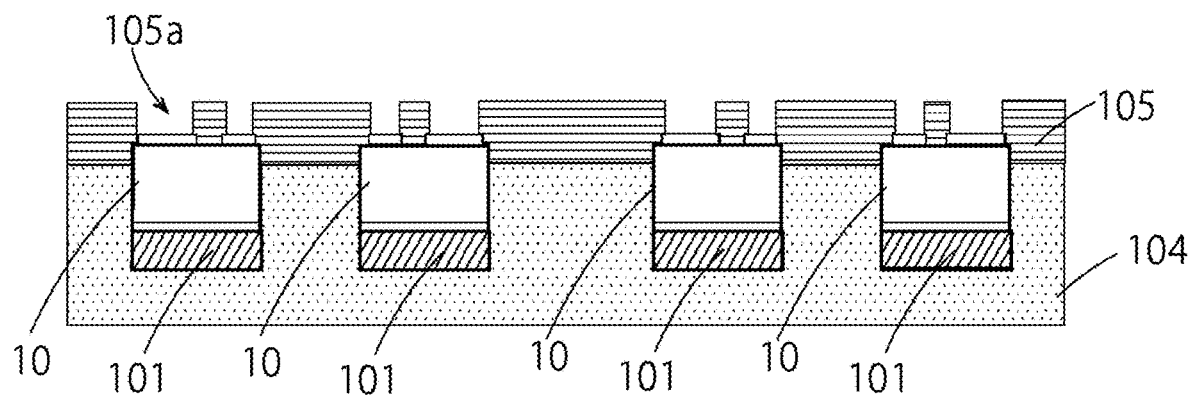
FIG. 16B is a cross-sectional view schematically showing a state that follows the initial state of FIG. 16A in the manufacturing method of the power semiconductor module of Embodiment 9 of the present invention.

Next, as illustrated in FIG. 16B, an insulating layer 105, which will be the first insulating layer 21, is formed, and then through holes (contact holes) 105a to be connected to the first electrode 11 and the second electrode 12 of each power semiconductor chip 10 are formed.

Figure 16C:
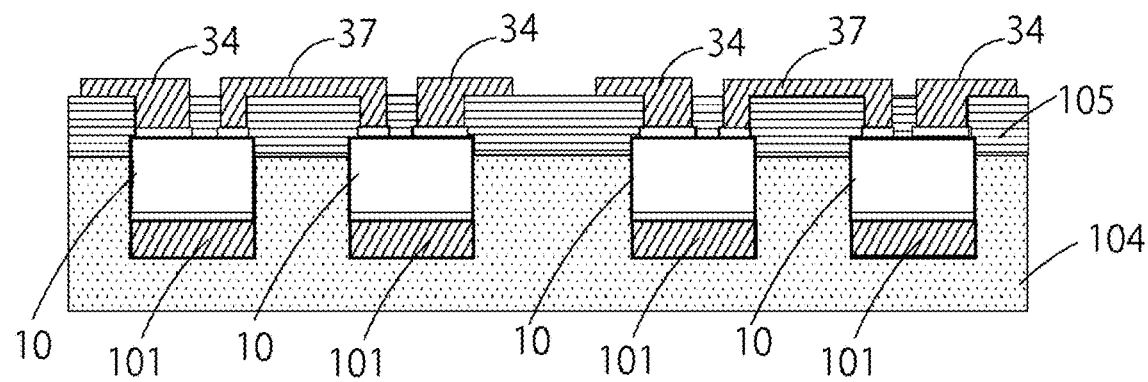
FIG. 16C is a cross-sectional view schematically showing a state that follows the state of FIG. 16B in the manufacturing method of the power semiconductor module of Embodiment 9 of the present invention.

Next, as illustrated in FIG. 16C, the first metal layer 34 of the fourth electrode 31 and the first metal layer 37 of the sixth electrode 33 are formed. Those metal layers may each be formed by depositing a corresponding metal layer and removing unnecessary portions from the metal layer through patterning.

Figure 16D:
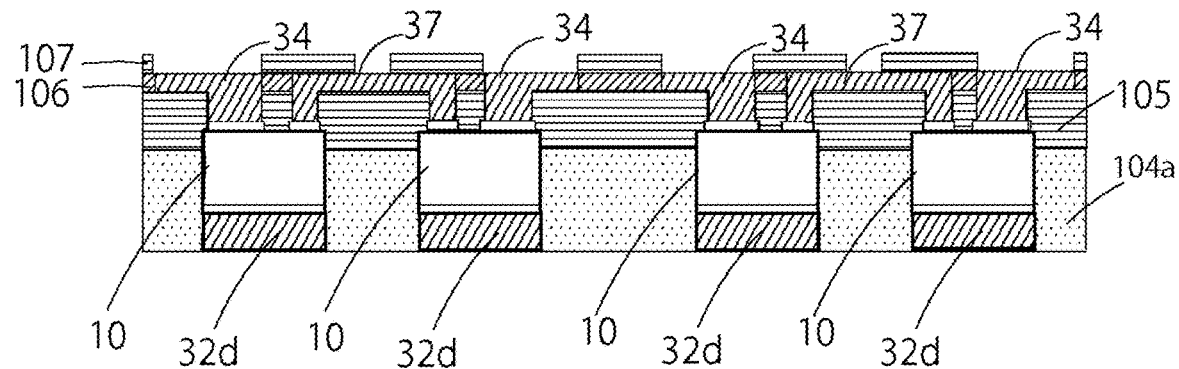
FIG. 16D is a cross-sectional view schematically showing a state that follows the state of FIG. 16C in the manufacturing method of the power semiconductor module of Embodiment 9 of the present invention.

Next, the mold resin layer 104 and the metal layer 101 are ground to a predetermined thickness, and polished by CPM or the like. As a result, a portion 32d of the first metal layer 32a of each fifth electrode 32 is formed. Around this time, an insulating layer 106, which will be the second insulating layer 22, and an insulating layer 107, which will be the third insulating layer 23, are provided, and through holes (contact holes) are formed to expose the first metal layer 34 of the fourth electrode 31 and the first metal layer 37 of the sixth electrode 33. FIG. 16D illustrates this state.

Figure 16E:
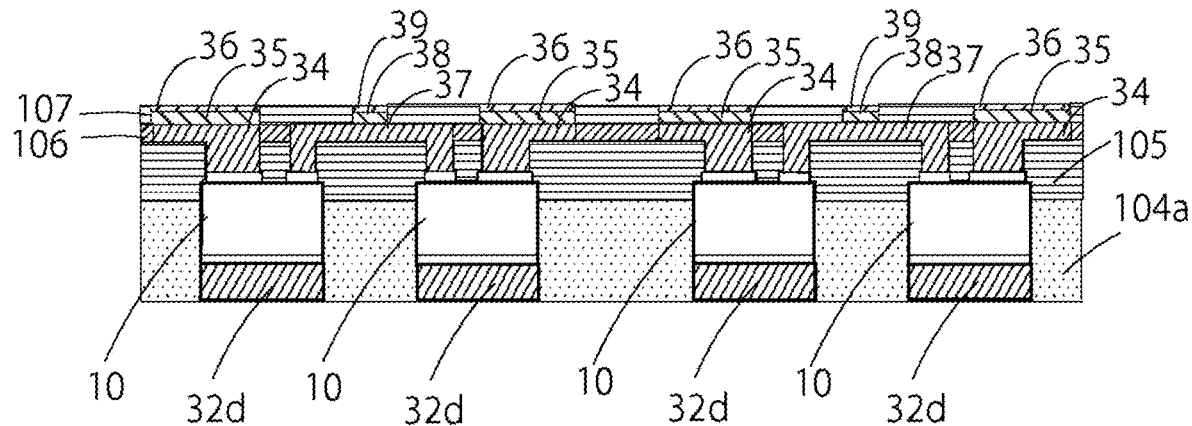
FIG. 16E is a cross-sectional view schematically showing a state that follows the state of FIG. 16D in the manufacturing method of the power semiconductor module of Embodiment 9 of the present invention.
Figure 16F:
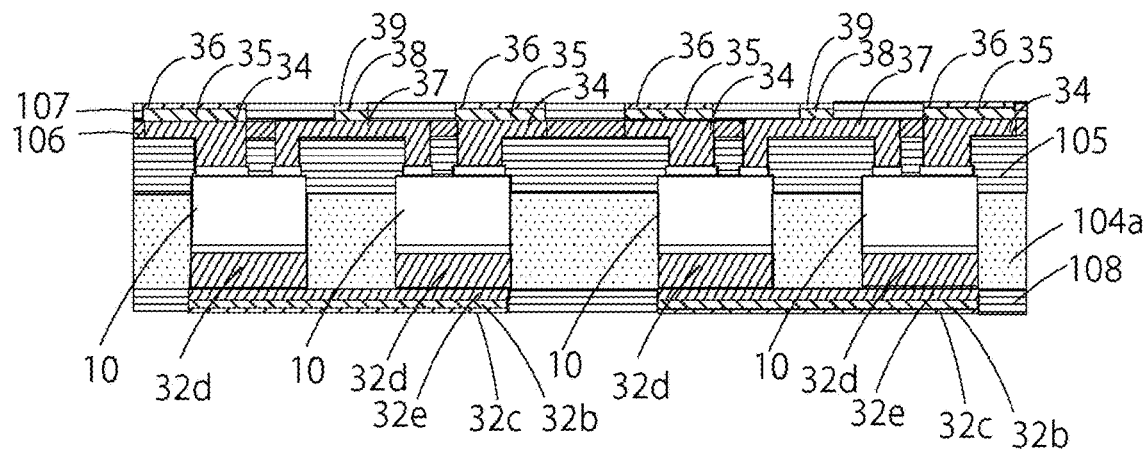
FIG. 16F is a cross-sectional view schematically showing a state that follows the state of FIG. 16E in the manufacturing method of the power semiconductor module of Embodiment 9 of the present invention.

Next, as shown in FIG. 16E, the second metal layer 35 of the fourth electrode 31 and the second metal layer 38 of the sixth electrode 33 are formed in the through holes of the insulating layer 107, and then, the third metal layer 36 of the fourth electrode 31 and the third metal layer 39 of the sixth electrode 33 are formed.

Around this time, an insulating layer, which will be the insulating layer 24, is formed on the rear surface, and through holes are formed so that the portion 32d of the first metal layer 32a in each fifth electrode 32 is exposed. Then, on the portion 32d of the first metal layer 32a in the fifth electrode 32, the remaining portion 32e of the first metal layer 32a is formed. As a result, the power semiconductor chips 10 are connected with each other through the first metal layer 32a of the fifth electrode 32. Thereafter, the second metal layer 32b of the fifth electrode 32 is formed, and then the third metal layer 32c of the fifth electrode 32 is formed. If the power semiconductor chips 10 are to be connected with each other through the second metal layer 32b of the fifth electrode 32, then formation of the remaining portion 32e of the first metal layer 32a is skipped.

Figure 16G:
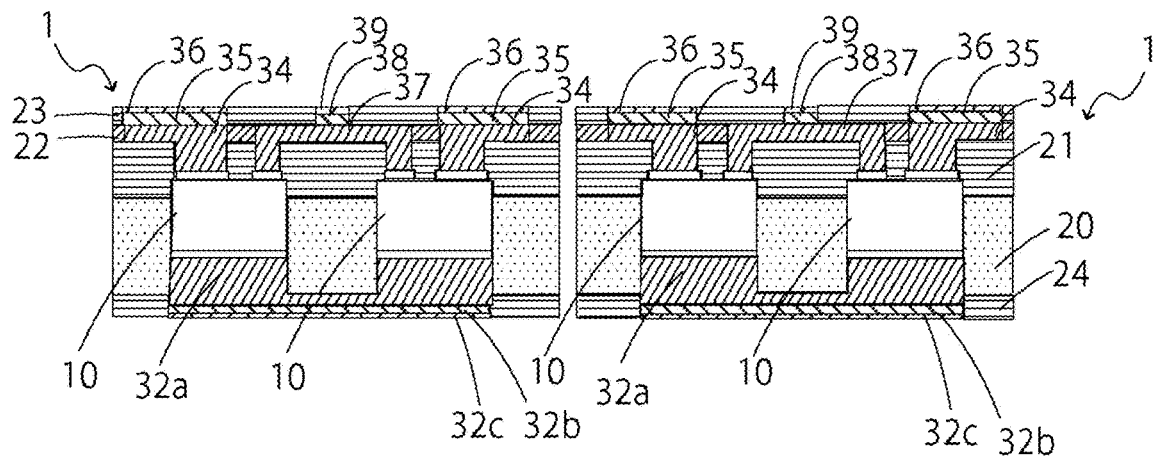
FIG. 16G is a cross-sectional view schematically showing a state that follows the state of FIG. 16F in the manufacturing method of the power semiconductor module of Embodiment 9 of the present invention.

Next, as illustrated in FIG. 16G, each power semiconductor devices 1 is cut out. The power semiconductor device 1 is manufactured in this way. Metal plates 40 each placed on the ceramic plates 53 and 54 are disposed on the upper and lower surfaces of the power semiconductor device 1 manufactured in the manner described above, and after attaching an outer frame for leak prevention, grease is applied, and the cooling part 55 is installed (see FIG. 13).

As described above, in the manufacturing method of the power semiconductor device 1 according to Embodiment 9 of the present invention, the fifth electrode 32 is formed by depositing the metal layer 101 made of Cu by plating, vapor deposition or sputtering, to a thickness that is at least 10 μm greater than the third electrode 13 of the power semiconductor chip 10, for example, molding the entire chip by resin, removing the mold by grounding, polishing, or the like to thin the metal layer 101 to 5 μm, for example, and forming other metal layers thereon.

Embodiment 10

Next, as Embodiment 10 of the present invention, a manufacturing method of the power semiconductor module 2 will be explained. A manufacturing method of the power semiconductor module 2 of Embodiment 5 will be explained below.

FIGS. 17A to 17F are schematic cross-sectional views for explaining the manufacturing method of the power semiconductor module 2 of Embodiment 10 of the present invention in an appropriate order. Please note that each diagram of FIGS. 17A to 17F does not represent one process, but may illustrate several processes together.

First, a plurality of power semiconductor chips 10 and a plurality of driving chips 60 are prepared. On the second surface of the power semiconductor chips 10 and the driving chips 60, a metal layer 101 made of a metal is formed to be thicker than the first metal layer 32a of the fifth electrode 32 and the first metal layer 72a of the fifth electrode 72.

Figure 17A:
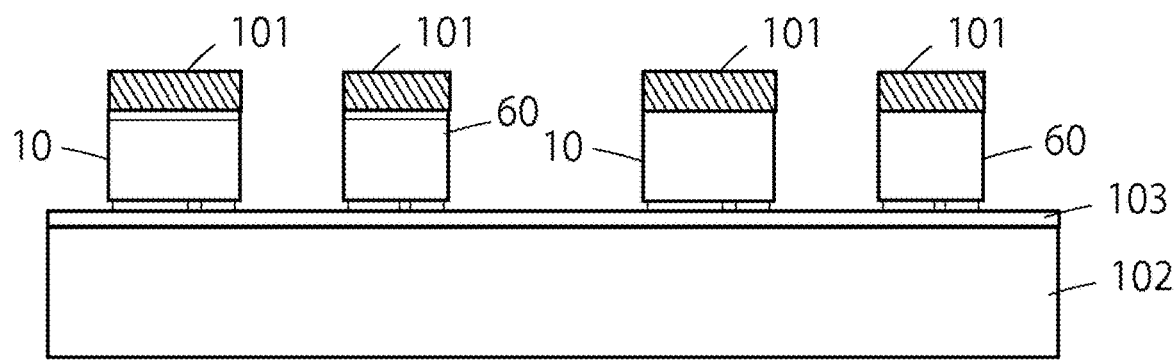
FIG. 17A is a cross-sectional view schematically showing the initial state in a manufacturing method of a power semiconductor module of Embodiment 10 of the present invention.

Next, as illustrated in FIG. 17A, an adhesive sheet 103 is placed on a carrier substrate 102, and the power semiconductor chips 10 and the driving chips 60 are arranged at prescribed intervals. The power semiconductor chips 10 and the driving chips 60 are arranged such that the second surface thereof faces up, and the first electrode and the second electrode on the first surface faces the adhesive sheet 103.

Next, in the state of FIG. 17A, a resin mold is formed. A mold resin layer 104 is made to be thick enough to mold the respective metal layers 101 on the power semiconductor chips 10 and the driving chips 60. Thereafter, the carrier substrate 102 and the adhesive sheet 103 are removed.

Figure 17B:
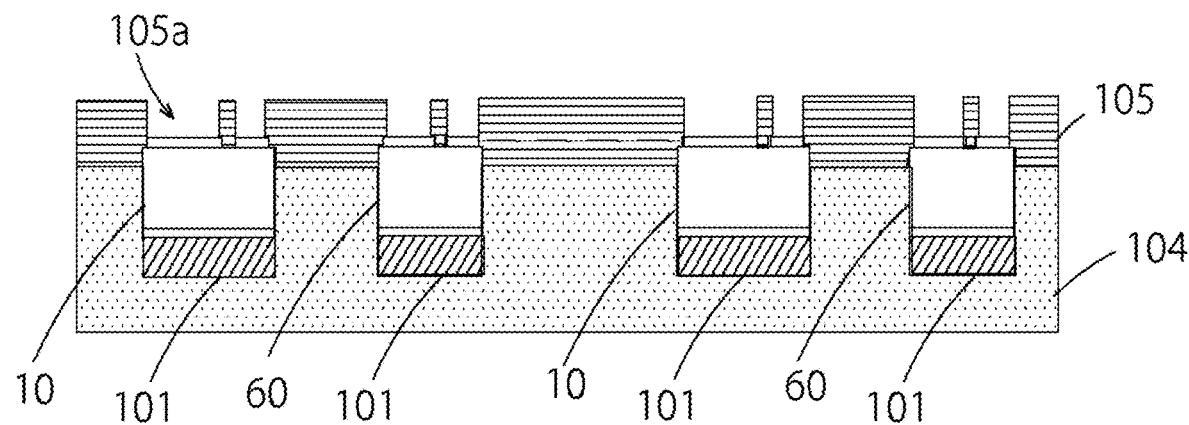
FIG. 17B is a cross-sectional view schematically showing a state that follows the state of FIG. 17A in the manufacturing method of the power semiconductor module of Embodiment 10 of the present invention.

Next, as illustrated in FIG. 17B, an insulating layer 105, which will be the first insulating layer 21, is formed, and then through holes (contact holes) 105a to be connected to the first electrode 11 and the second electrode 12 of each power semiconductor chip 10 and to the first electrode 61 and the second electrode 62 of each driving chip 60 are formed.

Figure 17C:
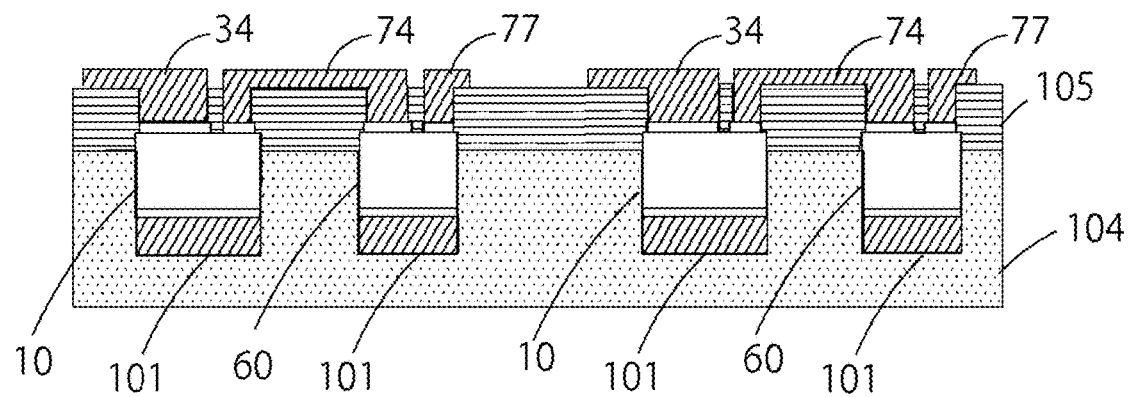
FIG. 17C is a cross-sectional view schematically showing a state that follows the state of FIG. 17B in the manufacturing method of the power semiconductor module of Embodiment 10 of the present invention.

Next, as illustrated in FIG. 17C, the first metal layer 34 of the fourth electrode 31, the first metal layer 74 of the connecting electrode 71, and the first metal layer 77 of the sixth electrode 73 are formed. Those metal layers may be formed by depositing a metal layer and removing unnecessary portions from the metal layer through patterning.

Figure 17D:
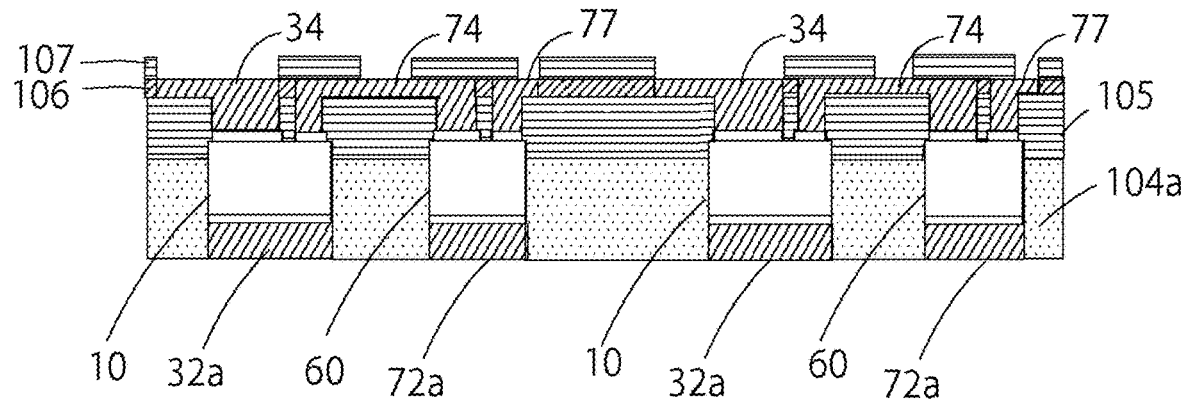
FIG. 17D is a cross-sectional view schematically showing a state that follows the state of FIG. 17C in the manufacturing method of the power semiconductor module of Embodiment 10 of the present invention.

Next, the mold resin layer 104 and the metal layer 101 are ground to a predetermined thickness, and polished by CPM or the like. Around this time, an insulating layer 106, which will be the second insulating layer 22, and an insulating layer 107, which will be the third insulating layer 23, are provided, and through holes (contact holes) are formed to expose the first metal layer 34 of the fourth electrode 31, the first metal layer 74 of the connecting electrode 71, and the first metal layer 77 of the sixth electrode 73. FIG. 17D illustrates this state.

Figure 17E:
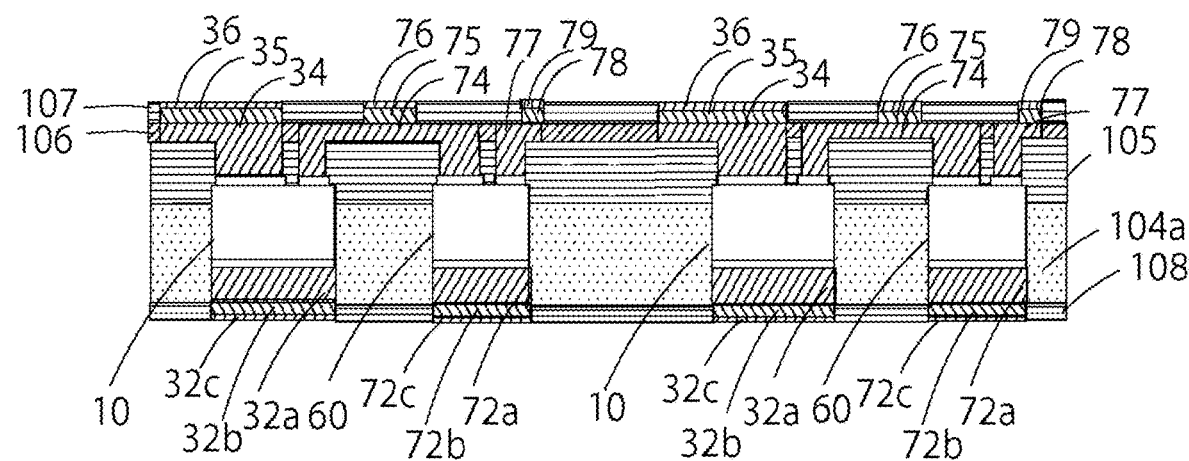
FIG. 17E is a cross-sectional view schematically showing a state that follows the state of FIG. 17D in the manufacturing method of the power semiconductor module of Embodiment 10 of the present invention.
Figure 17F:
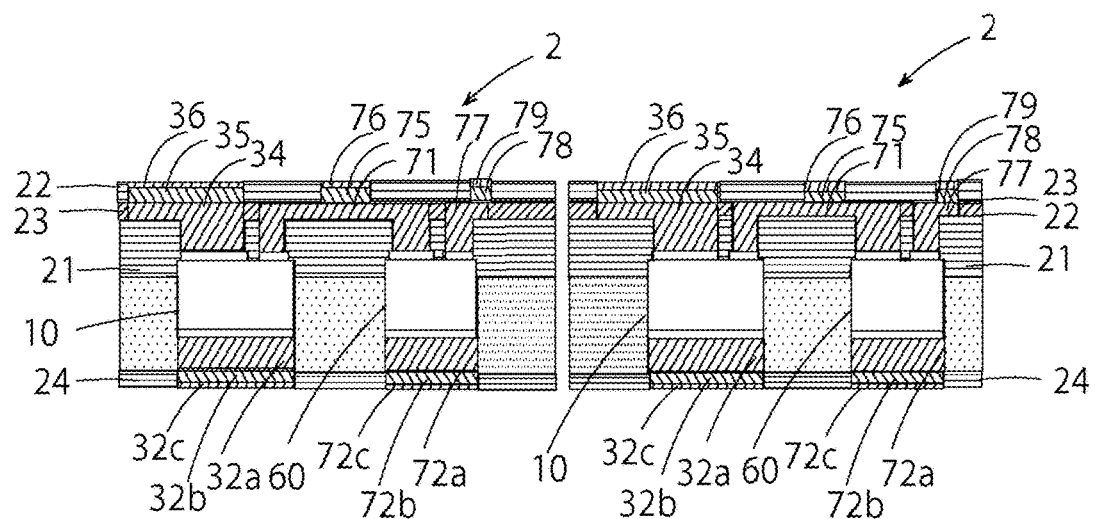
FIG. 17F is a cross-sectional view schematically showing a state that follows the state of FIG. 17E in the manufacturing method of the power semiconductor module of Embodiment 10 of the present invention.

Next, as shown in FIG. 17E, the second metal layer 35 of the fourth electrode 31, the second metal layer 75 of the connecting electrode 71, and the second metal layer 78 of the sixth electrode 73 are formed in the through holes of the insulating layer 107, which will be the third insulating layer 23, and then, the third metal layer 36 of the fourth electrode 31, the third metal layer 76 of the connecting electrode 71, and the third metal layer 79 of the sixth electrode 73 are formed.

Around this time, an insulating layer 108, which will be the insulating layer 24, is formed on the rear surface, and through holes are formed to expose the first metal layer 32a of the fifth electrode 32 and the first metal layer 72a of the fifth electrode 72. Thereafter, the second metal layer 32b of the fifth electrode 32 and the second metal layer 72b of the fifth electrode 72 are formed, and then the third metal layer 32c of the fifth electrode 32 and the third metal layer 72c of the fifth electrode 72 are formed.

Next, as illustrated in FIG. 17G, each power semiconductor modules 2 is cut out. The power semiconductor module 2 is manufactured this way. Metal plates 40 each placed on the ceramic plates 53 and 54 are disposed on the upper and lower surfaces of the power semiconductor module 2 manufactured in the manner described above, and after attaching an outer frame for leak prevention, grease is applied, and the cooling part 55 is installed (see FIG. 14).

As described above, in the manufacturing method of the power semiconductor module 2 according to Embodiment 10 of the present invention, the fifth electrode 32 and the fifth electrode 72 are formed by depositing the metal layer 101 made of Cu by plating, vapor deposition or sputtering, to a thickness that is at least 10 μm greater than the third electrodes 13 and 63 of the power semiconductor chip 10 and the driving chip 60, for example, molding the entire chip by resin, removing the mold by grounding, polishing, or the like to thin the metal layer 101 to 5 μm, for example, and forming other metal layers thereon.

The manufacturing method of the power semiconductor device 1 and the power semiconductor module 2 according to Embodiments 9 and 10 of the present invention has the following configurations:

First, one or a plurality of power semiconductor chips 10 and one or a plurality of driving chips 60, in which the metal layer 101 made of a Cu layer, an Al layer or an alloy layer containing Cu or Al is formed on the rear surface of the third electrodes 13 and 63, are arranged on the adhesive sheet 103 (see FIGS. 16A and 17A), for example.

Next, a resin layer (such as the mold resin layer 104) is provided to surround the outer side faces of the power semiconductor chip 10 including the metal layer 101. The resin layer (such as the mold resin layer 104) is formed such that the metal layer 101 is not exposed.

Then, the metal layer 101 and the resin layer (such as the mold resin layer 104) are grounded or polished until at least part of the metal layer 101 is removed.

This way, it is possible to enclose the power semiconductor chip 10 with the enclosure 20, and to form the first metal layer 32a of the fifth electrode 32 (and the second metal layer 72a of the fifth electrode 72) on the second surface of the power semiconductor chip 10.

In one or a plurality of power semiconductor chips 10, after forming the insulating layer 105 on the first surface, the through hole 105a is formed at a prescribed location, and the first metal layer 34 of the fourth electrode 31 is formed in this through hole 105a. Also, after forming the insulating layer 106 on the first surface, the through hole 106a is formed at a prescribed location, and the second metal layer 35 of the fourth electrode 31 is formed in this through hole 106a. The third metal layer 36 of the fourth electrode 31 is formed in this manner as well. By repeating the processes described above, a re-wiring layer is formed by the plurality of metal layers on the first surface of the power semiconductor chip 10, and the fourth electrode 31 can be formed in an area larger than the first electrode 11 (main cell area 16A of FIG. 10) of the power semiconductor chip 10. This description about the re-wiring layer being constituted of a plurality of metal layers formed on the first surface of the power semiconductor chip 10 applies to the connecting electrode 71 and the sixth electrode 73 as well.

Figure 18:
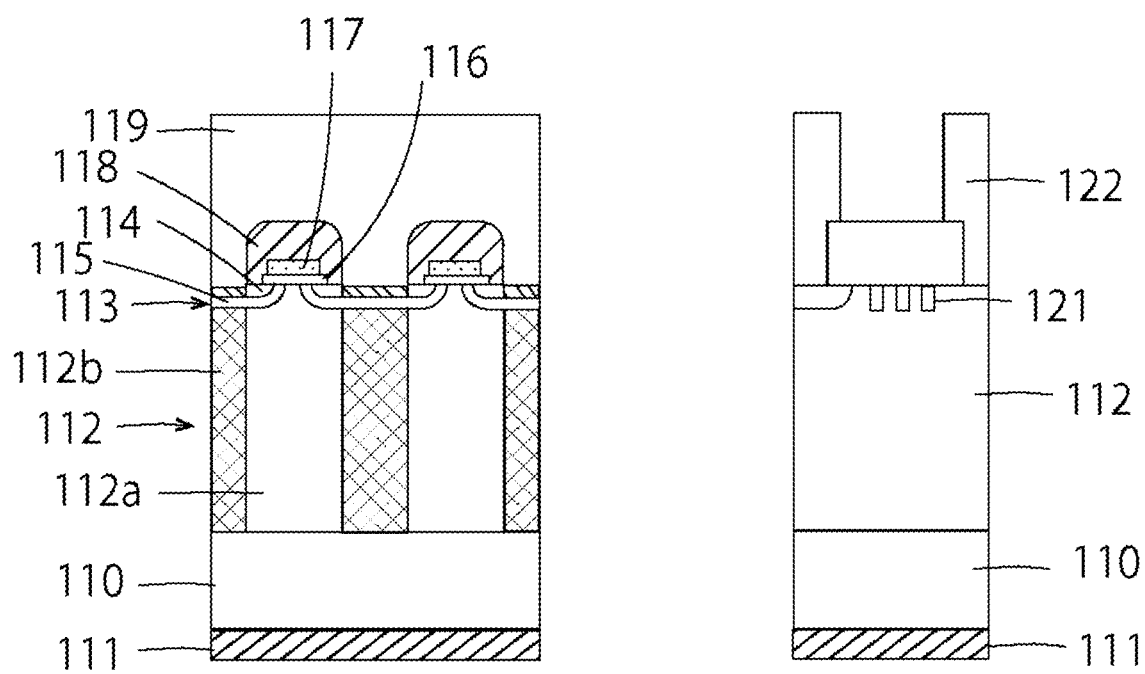
FIG. 18 is a cross-sectional view showing an example of a power semiconductor chip.

Below, an example of the power semiconductor chip 10 will be explained. FIG. 18 is a cross-sectional view showing an example of the power semiconductor chip 10. The left side of FIG. 18 is a cross-sectional view of part of the main cell area 16A, and the right side of FIG. 18 is a cross-sectional view of the termination area 14A of the power semiconductor chip 10. The power semiconductor chip 10 has the following planar type MOS structure, for example: a drain region 110 is constituted of a power semiconductor substrate, and in the drain region 110, a drain electrode 111 as a rear electrode (or lower electrode) is formed, and a drift region 112 is formed on the drain region 111; this drain region 112 includes one column 112a and the other column 112b (such as N column and P column); the N column is an N-type drift region, and the P column is a P-type drift region; a body region 113 is formed in the surface region of the drift region 112, and a source region 114 and a body contact region 115 are formed in the body region 113; a gate electrode 117 is formed on a gate insulating layer 116 that is formed on the semiconductor surface of the source region 114; on the gate electrode 117, an interlayer insulating layer 118 is formed, and on the interlayer insulating layer 118, a source electrode 119 is formed. Although the planer type is illustrated in the figure, the trench type structure may alternatively be used. Also, IGBT may be used instead of MOS.

As for the structure of the termination region 14A, as shown on the right side of FIG. 18, a GR (guard ring) layer 121 is formed on the surface of the drift region 112, and a guard ring metal layer 122 is formed thereon. The structure of the termination region 14A is not limited to this, and may be the RESURF structure, the field plate structure, or a combination thereof.

In one power semiconductor module, a set of power semiconductor chips 10 may be connected to each other, constituting an upper arm and a lower arm, respectively. The number of the set may be one, two, or three.

Embodiment 11

A power semiconductor module of Embodiment 11 of the present invention includes one or a plurality of power semiconductor devices 1 described above, and a metal layer (such as the third metal layer 36) included in the fourth electrode 31 is exposed to the outside in a direction parallel to the first surface of the power semiconductor chip 1 and can be electrically connected to an external terminal. The power semiconductor module has a first side (upper side) and a second side (lower side) opposite to each other, and each power semiconductor device has a first side (upper side) and a second side (lower side) opposite to each other. The power semiconductor module of Embodiment 11 includes a plurality of power semiconductor devices in a first group and includes a plurality of power semiconductor devices in a second group, and the first side of each of the power semiconductor devices in the first group and the second side of each of the power semiconductor devices in the second group are both arranged to be located at one of the first side or the second side of the semiconductor module. The detailed of Embodiment 11 will be explained hereinafter.

Figure 19A:
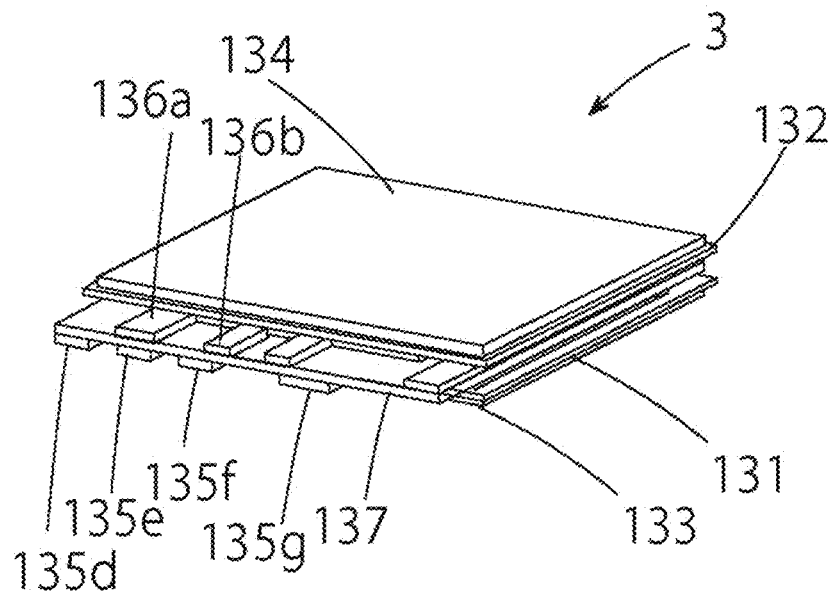
FIG. 19A is a perspective view of a power semiconductor module of Embodiment 11 of the present invention.
Figure 19B:
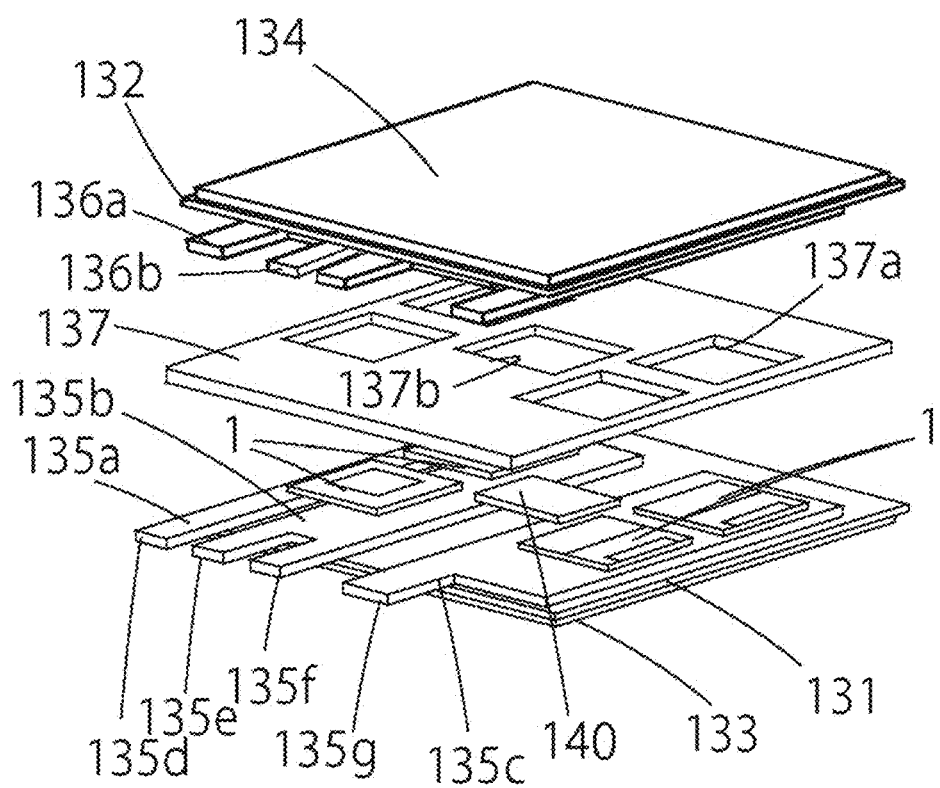
FIG. 19B is a partially exploded view of the power semiconductor module of Embodiment 11 of the present invention.

FIG. 19A is a perspective view of a power semiconductor module 3 according to Embodiment 11 of the present invention, and FIG. 19B is a partially exploded view of the power semiconductor module 3 of Embodiment 11 of the present invention. The power semiconductor module 3 according to Embodiment 11 of the present invention includes a first ceramic plate 131, a second ceramic plate 132, a metal plate 133 provided on the first ceramic plate 131 on the side not facing the second ceramic plate 132, a metal plate 134 provided on the second ceramic plate 132 on the side not facing the first ceramic plate 131, a plurality of metal plates 135*a*, 135*b*, and 135*c* provided on the first ceramic plate 131 on the side facing the second ceramic plate 132, and a plurality of metal plates 136*a* and 136*b* provided on the second ceramic plate 132 on the side facing the first ceramic plate 131. One or a plurality of power semiconductor devices 1 are sandwiched by the metal plates 135*a*, 135*b* and 135*c* and the metal plates 136*a* and 136*b* such that the corresponding fourth electrode 31, fifth electrode 32, and sixth electrode 33 of the power semiconductor device 1 can be electrically connected with each other via solder or a conductive bonding material.

In this embodiment, four power semiconductor devices 1 are provided. An insulating frame member 137 is sandwiched between the opposing surfaces of the first ceramic plate 131 and the second ceramic plate 132. The frame member 137 has four openings 137*a*, and a power semiconductor device 1 is placed in each opening 137*a*. As illustrated in the figure, in a pair of adjacent openings 137*a*, the power semiconductor devices 1 are arranged such that the fourth electrode 31 and the sixth electrode 33 face the first ceramic plate 131, and in the other pair of openings 137*a*, the power semiconductor devices 1 are arranged such that the fifth electrode 32 faces the first ceramic plate 131.

Figure 20A:
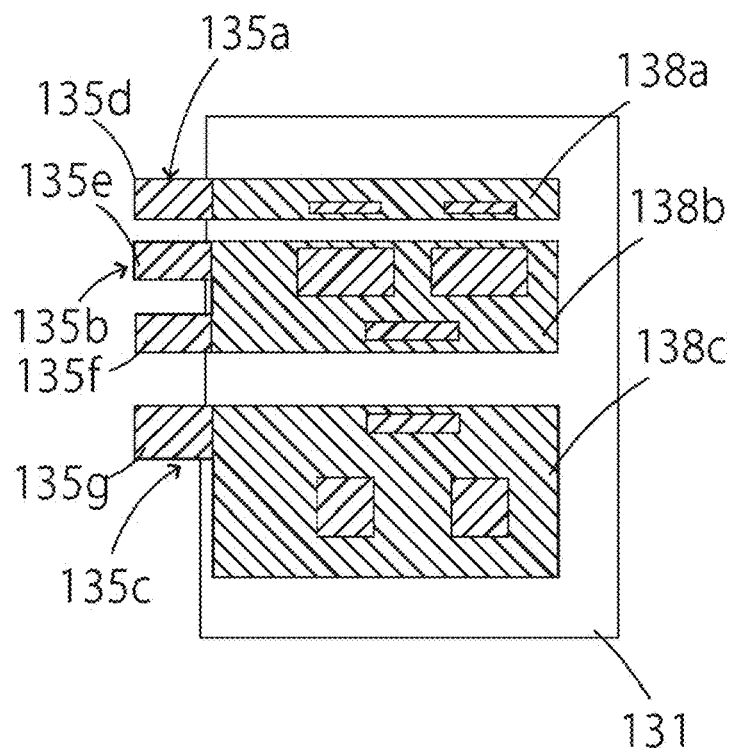
FIG. 20A is a plan view of a first ceramic plate and a metal plate attached thereto.
Figure 20B:
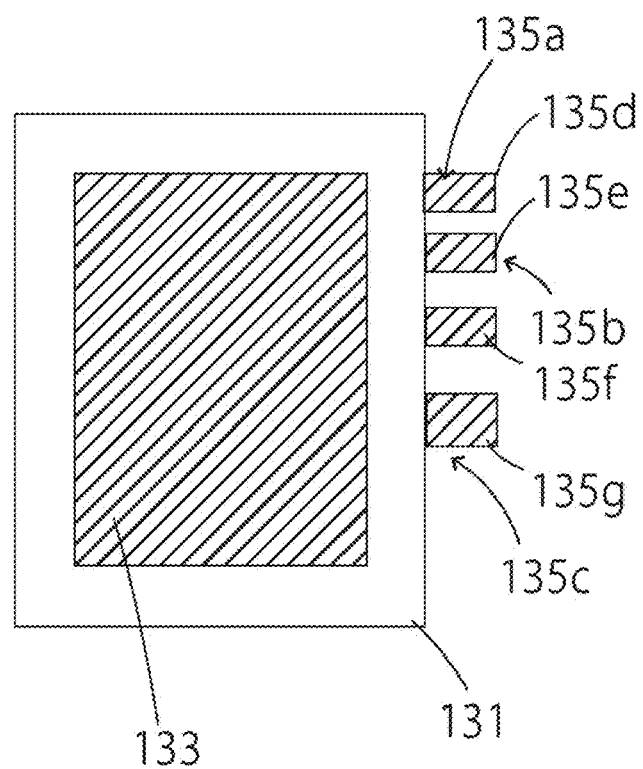
FIG. 20B is a bottom view of the first ceramic plate and the metal plate attached thereto.

FIG. 20A is a plan view of the first ceramic plate 131 and the metal plates attached thereto, and FIG. 20B is a bottom view of the first ceramic plate 131 and the metal plates attached thereto. As illustrated in FIG. 20B, a metal plate 133 is provided on the first ceramic plate 131 on the side not facing any other components, excluding the peripheral edge portion thereof, and a plurality of metal plates 135*a*, 135*b*, and 135*c* are provided on the first ceramic plate 131 on the side facing the second ceramic plate 132. Insulating layers 138*a*, 138*b*, and 138*c* are patterned such that the metal plates 135*a*, 135*b*, and 135*c* can be electrically connected to the corresponding fourth electrode 34, fifth electrode 35, and sixth electrode 36 of the power semiconductor device 1. As illustrated in FIG. 20A, the insulating layer 138*a* has an opening so that the sixth electrode 33 of the power semiconductor device 1 is connected to the metal plate 135*a*. The insulating layer 138*b* has an opening so that the fourth electrode 31 of the power semiconductor device 1 is connected to the metal plate 135*b*. The insulating layer 138*c* has an opening so that the fifth electrode 32 of the power semiconductor device 1 is connected to the metal plate 135*c*. The respective metal plates 135*a*, 135*b*, and 136*c* are protruding outwardly from the outer periphery of the first ceramic plate 131, and by the protruding portions, external terminals 135*d*, 135*c*, 135*f*, and 135*g* are formed for external connection. The external terminal 135*e* and the external terminal 135*f* are formed of the same metal plate 135*b*, and one of them is a terminal for the source electrode, and the other is a terminal for the auxiliary source electrode, for example. The auxiliary source terminal is provided to keep the potential reference point of a control signal from the control electrode, such as a gate signal, in the chip electrode of the power semiconductor chip 10, which makes it possible to prevent the voltage drop at parasitic inductance that occurs in the wiring connecting the potential reference point of the gate signal placed outside of a package to the chip inside the package.

Figure 21A:
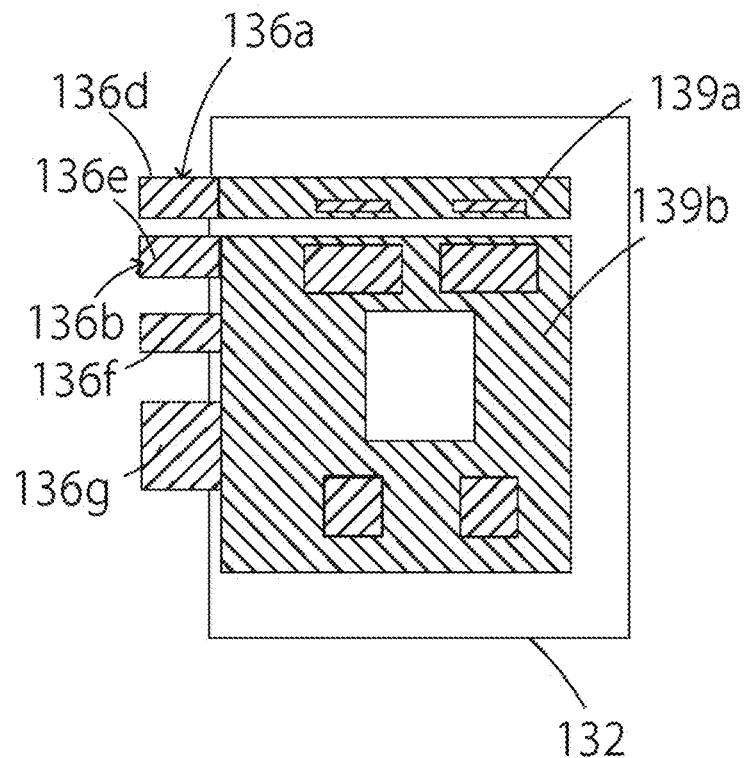
FIG. 21A is a plan view of a second ceramic plate and a metal plate attached thereto.
Figure 21B:
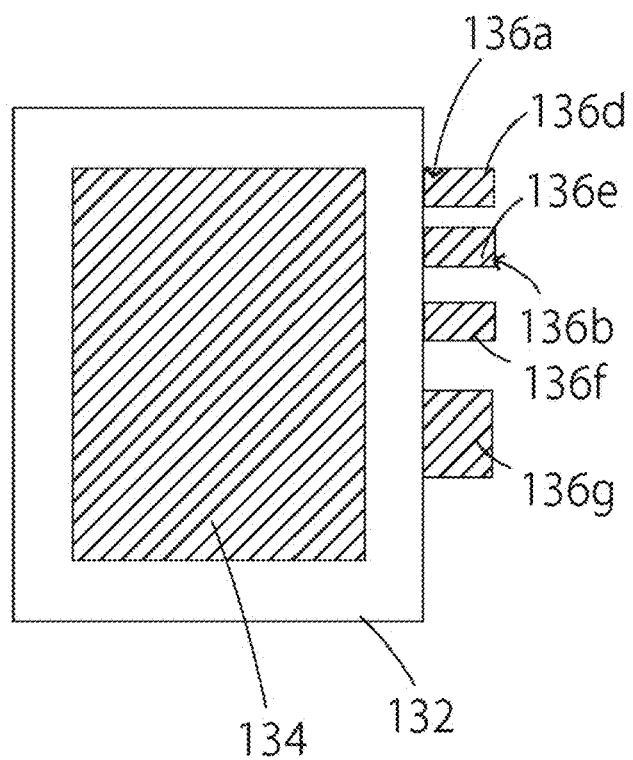
FIG. 21B is a bottom view of the second ceramic plate and the metal plate attached thereto.

FIG. 21A is a plan view of the second ceramic plate 132 and the metal plates attached thereto, and FIG. 21B is a bottom view of the second ceramic plate 132 and the metal plates attached thereto. As illustrated in FIG. 21B, a metal plate 134 is provided on the second ceramic plate 132 on the side not facing any other components excluding the outer periphery, and a plurality of metal plates 136*a* and 136*b* are provided on the second ceramic plate 132 on the side facing the first ceramic plate 131. Insulating layers 139*a* and 139*b* are patterned such that the metal plates 136*a* and 136*b* can be electrically connected to the corresponding fourth electrode 31, fifth electrode 32, and sixth electrode 33 of the power semiconductor device 1. As illustrated in FIG. 21A, the insulating layer 139*a* has an opening so that the sixth electrode 33 of the power semiconductor device 1 is connected to the metal plate 136*a*. The insulating layer 139*b* has openings so that the fourth electrode 31 of the power semiconductor device 1 and the fifth electrode 32 of the power semiconductor device 1 are connected to the metal plate 136*b*. The respective metal plates 136*a* and 136*b* are protruding outwardly from the outer periphery of the second ceramic plate 132, and by the protruding portions, external terminals 136*d*, 136*e*, 136*f*, and 136*g* are formed for external connection. One of the external terminal 136*e* and the external terminal 136*f* is a terminal for the source electrode, and the other is a terminal for the auxiliary source electrode.

Figure 22:
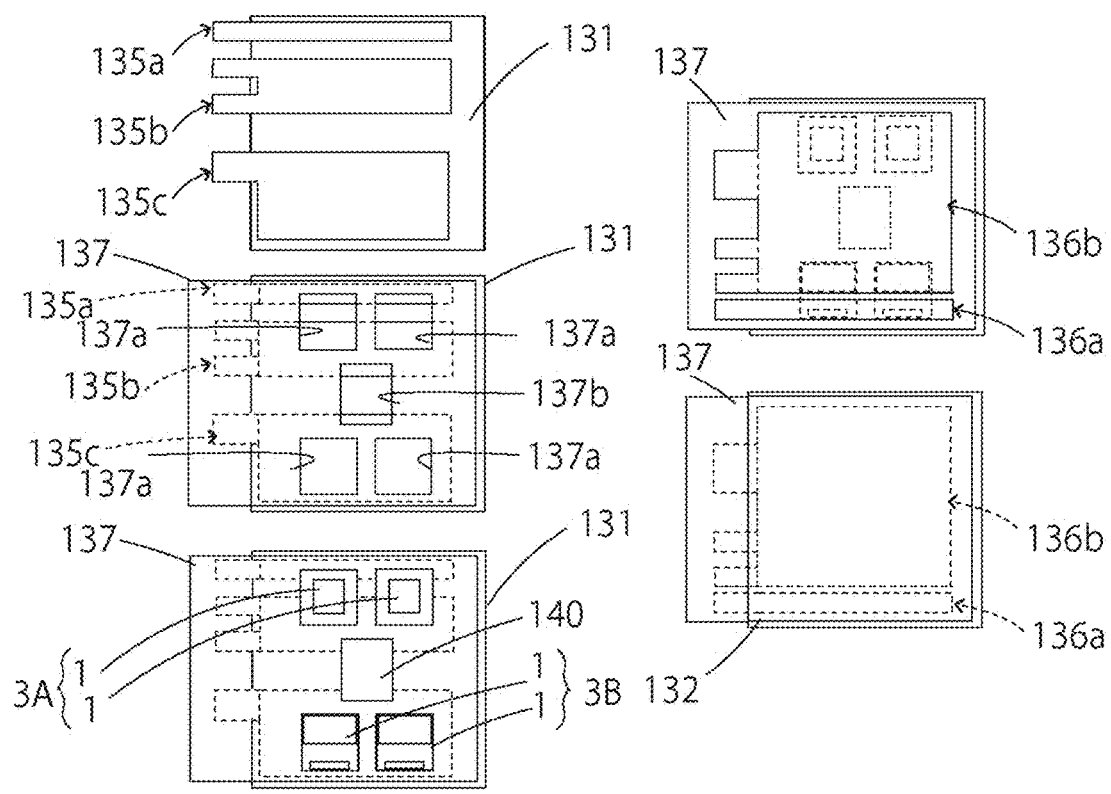
FIG. 22 is a plan view showing a temporarily assembled power semiconductor module of FIG. 19A in the direction sandwiched by the two ceramic plates to illustrate the state of each component.

It is preferable that the insulating layers 138*b* and 138*c* corresponding to the metal plate 135*b* and the metal plate 135*c* of the first ceramic plate 131, respectively, each have an opening, and that a snubber capacitor 140 be formed between the metal plate 135*b* and the metal plate 135*c* with those openings (see FIG. 22).

FIG. 22 is a plan view showing a temporarily assembled power semiconductor module 3 of FIG. 19A in the direction sandwiched by the two ceramic plates to illustrate the state of each component. As illustrated in the top left part of FIG. 22, the first ceramic plate 131 is placed such that the metal plates 135*a*, 135*b*, and 135*c* face up. In FIG. 22, the insulating layers 137*a*, 137*b*, and 137*c* are omitted. As illustrated in the middle left part of FIG. 22, the frame member 137 is placed thereon. As illustrated in the bottom left part of FIG. 22, the power semiconductor devices 1 are placed in the respective openings 137*a* of the frame member 137. The power semiconductor devices 1 are placed such that the sixth electrode 33, the fourth electrode 31, and the fifth electrode 32 are connected to the metal plates 135*a*, 135*b*, and 135*c* disposed below. As necessary, the snubber capacitor 140 is placed in the center opening 137b of the frame member 137 such that the electrode faces down. Then as illustrated in the right side of FIG. 22, the second ceramic plate 132 is placed such that the metal plates 136a and 136b face up. The power semiconductor device 1 is placed such that the sixth electrode 33 of the power semiconductor device 1 is connected to the metal plate 136a disposed above. In FIG. 22, the insulating layers 139a, 139b, and the metal plate 134 are not illustrated, and the components disposed below are depicted with the broken lines as necessary to illustrate the relationship with those components disposed below. The respective metal plates 135a, 135b, 135c, 136a, and 136b are connected to the corresponding fourth electrode 31, fifth electrode 32 and sixth electrode 33 via solder or a conductive bonding member.

Figure 23:
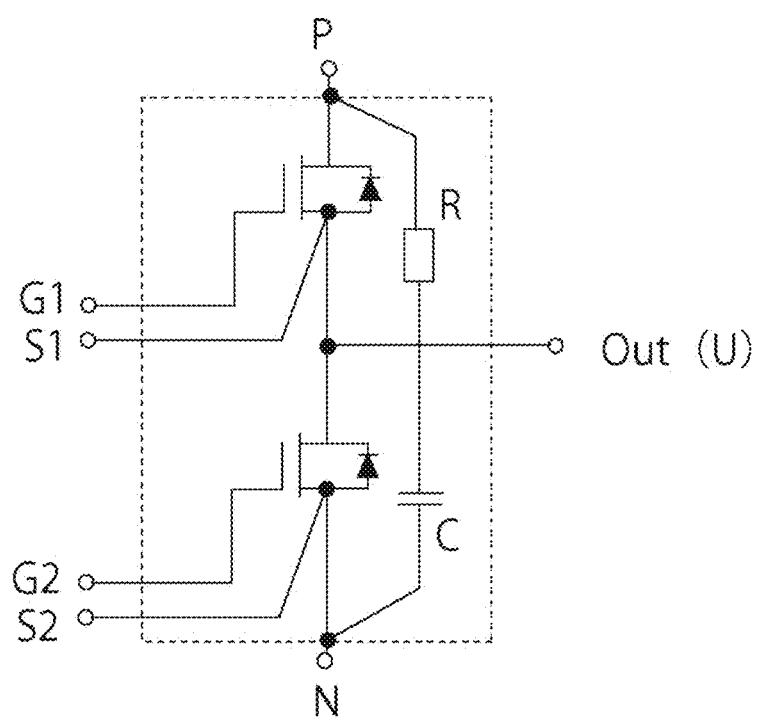
FIG. 23 is an equivalent circuit diagram of the power semiconductor module of FIG. 19A.

FIG. 23 is an equivalent circuit diagram of the power semiconductor module 3 illustrated in FIG. 19A. In the power semiconductor device 1, a power transistor and a diode are connected in parallel. A snubber capacitor C and resistance R are disposed between P and N. G1 and G2 are external terminals for the gate, S1 and S2 are external terminals for the auxiliary source, and Out (U) is an external terminal for the output. Those elements constitute the upper arm and the lower arm.

As described above, the power semiconductor module 3 of Embodiment 11 of the present invention includes a plurality of power semiconductor devices 1 belonging to the first group 3A, and a plurality of power semiconductor devices 1 belonging to the second group 3B, and the plurality of power semiconductor devices 1 of the first group 3A and the second group 3B have the configuration according to Embodiment 1. That is, the power semiconductor device 1 includes: the power semiconductor chip 10 having the first electrode 11 and the second electrode 12 on the first surface and the third electrode 13 on the second surface that is opposite from the first surface, with the first electrode 11 being provided in the main cell area; the fourth electrode 31 disposed to be electrically connected to the first electrode 11 of the power semiconductor chip 1 and having an overhanging portion that overhangs outwardly from the outer periphery of the corresponding power semiconductor chip 10; the fifth electrode 32 disposed to be electrically connected to the third electrode 13 of the corresponding power semiconductor chip 1; and the sixth electrode 33 disposed to be electrically connected to the second electrode 12 of the corresponding power semiconductor chip 10. The fourth electrode 31 and the sixth electrode 33 of each of the power semiconductor devices 1 in the first group 3A are disposed to face the same direction as the fifth electrode 32 of each of the power semiconductor devices 1 in the second group 3B. That is, the fourth electrode 31 and the sixth electrode 33 of each of the power semiconductor devices 1 in the second group 3B are disposed to face the same direction as the fifth electrode 32 of each of the power semiconductor devices 1 in the first group 3A. The fourth electrode 31 of each of the power semiconductor devices 1 in the first group 3A, the fifth electrode 32 of each of the power semiconductor devices 1 in the first group 3A, the sixth electrode 33 of each of the power semiconductor devices 1 in the first group 3A, the fourth electrode 31 of each of the power semiconductor devices 1 in the second group 3B, the fifth electrode 32 of each of the power semiconductor devices 1 in the second group 3B, and the sixth electrode 33 of each of the power semiconductor devices 1 in the second group 3B are disposed to be electrically connected to external terminals through the metal plates 135a, 135b, 135c, 136a, and 136b constituting corresponding external terminals for the fourth electrodes 31, the fifth electrodes 32, and the sixth electrodes 33 of each group. In FIGS. 20A, 20B, 21A and 21B, the metal plates 135a, 135b, 136a, and 136b are supported by the corresponding first ceramic plate 131 and second ceramic plate 132, and can thus be made thin, and may each be a metal layer made of a metal (including an alloy). Therefore, the metal plates 135a, 135b, 135c, 136a, and 136b may be referred to as external connecting electrodes, as they can be metal (including an alloy) layers.

In the power semiconductor device 1 of the embodiments of the present invention, one or a plurality of power semiconductor chips are re-wired using a multilayer wiring layer, and because of the structure without any wires or lead frame, the inductance can be reduced as compare with a structure with wires or a lead frame. Also, the multilayer wiring structure allows for not only electrical conduction, but also heat transfer and dissipation. By integrating a plurality of power semiconductor chips into one package, it is possible to achieve an output as great as the multiples of natural numbers of the output of one power semiconductor chip. The power semiconductor device 1 and the power semiconductor modules 2 and 3 according to the embodiments of the present invention can be water-cooled through immersion. Possible applications include small robots such as drones, data centers, trains, electric vehicles, and the like, depending on the number of power semiconductor chips 10 included in the power semiconductor device 1.

Even when a power semiconductor chip is made of a semiconductor material such as GaN and thus has a small output, it is possible to connect the sources, gates, and drains of power semiconductor chips through the multilayer wiring layer.

Conventionally, the power semiconductor chip was so small that it was difficult to connect a wire or lead frame to the chip, and therefore mass production was not possible. Also, if a wire or lead frame was not connected to each chip, then a large current flow cannot be attained. Furthermore, it was difficult to transfer heat generated at the junction part (heat generating part) in the chip to the outside. Conventionally, in the technique of a power semiconductor device having a small output and small chip, a re-wiring layer was not used because it would increase the cost. However, by connecting the first electrode, second electrode and third electrode of one or a plurality of power semiconductor chips to an external terminal using a re-wiring layer as in the embodiments of the present invention, an electrode with an overhanging portion can be provided, which allows for a large current flow and heat dissipation.

In any one of the embodiments of the present invention, each electrode constituting the re-wiring layer has a multilayer structure including a layer made of a material with high heat conductivity. The layer made of a material with high heat conductivity (such as the first metal layer) has a thickness of 100 μm to 300 μm (at least 75 μm, more preferably 100 μm). This makes it possible to transfer heat generated in the power semiconductor chip to the outside via the first metal layer, and to make an electrical current to flow. In particular, because the first metal layer has a larger cross-sectional area relative to the thickness area, the current density can be gradually reduced.

<Miscellaneous>

Below, variations of the embodiments of the present invention described above will be explained.

Figure 24A:
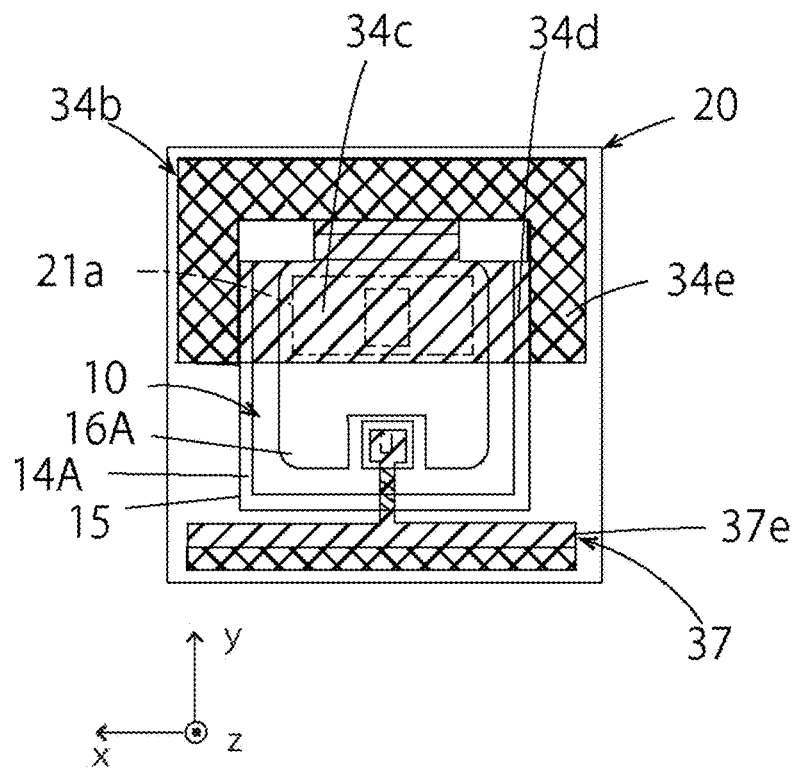
FIG. 24A is a diagram showing a pattern of a fourth electrode in a power semiconductor device.
Figure 24B:
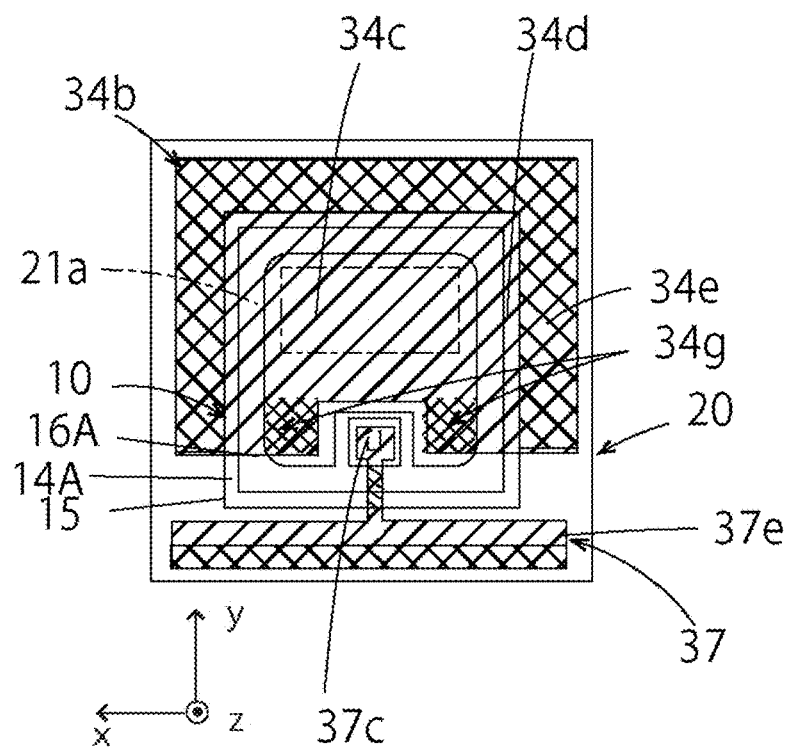
FIG. 24B is a diagram showing a pattern of a fourth electrode in another power semiconductor device that differs from FIG. 24A.

FIGS. 24A and 24B are diagrams showing a pattern of the fourth electrode in the power semiconductor device 1. The same reference characters as the components illustrated in FIGS. 2 and 9 are assigned. As illustrated in FIG. 24A, the fourth electrode 31 has a portion 34c overlapping with the main cell area 16A, a portion 34d overlapping with the area from the termination area to the chip outer periphery, and a portion 34e overlapping with the enclosure 20. The portion 34d acts as a bridge between the portion 34c and the portion 34e, and has three portions: portions extending in the +x direction and the −x direction, and a portion extending in the +y direction. This way, it is possible to ensure that a metal layer to be the fourth electrode 31 is not formed in an area between the portion 34c and the portion 34e. This allows for stress distribution.

As illustrated in 24B, the fourth electrode 31 has a portion 34c overlapping with the main cell area 16A, a portion 34d overlapping with the area from the termination area to the chip outer periphery, and a portion 34e overlapping with the enclosure 20. The fourth electrode 31 illustrated in FIG. 24B differs from FIG. 24A in having portions 34g that sandwich a portion 37c in the x-axis direction. The portion 37a overlaps with a section in the main cell area 16A where the gate electrode is formed.

<Prototype Example>

Figure 25:
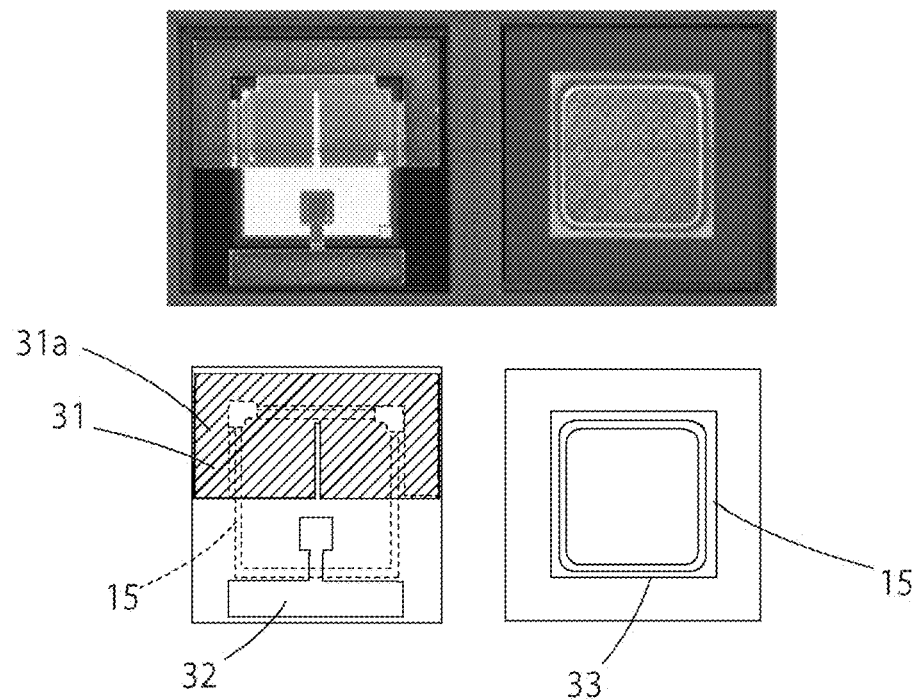
FIG. 25 is a microscopic image of a prototype where the top left side is the first surface side, the top right side is the second surface side, and line diagrams illustrating main components in the microscopic image are shown at the bottom left side and bottom right side.

Next, a prototype example will be explained. FIG. 25 shows micrographs of a prototype where the top left is the first surface side, the top right is the second surface side, and the left bottom and right bottom diagrams are line diagrams representing the micrographs. On the bottom, images for the micrographs are shown. As illustrated in FIG. 25, the majority of the first surface of the power semiconductor chip is the main cell area (source electrode), and the fourth electrode 31 is disposed to be electrically connected to the half of the main cell area. The fourth electrode 31 has an overhanging electrode that extends in the x direction and y direction toward the outside of the power semiconductor chip 10 by the extending portion 34b. The sixth electrode (gate electrode) is formed in part of the remaining half of the first surface of the power semiconductor chip 10, and has an overhanging electrode that extends from the sixth electrode in the y direction on the insulating layer formed on the termination area along the y direction. On the other hand, the third electrode (drain electrode) is formed on the entire second surface of the power semiconductor chip 10, and the fifth electrode 32 is formed thereon.

Figure 26:
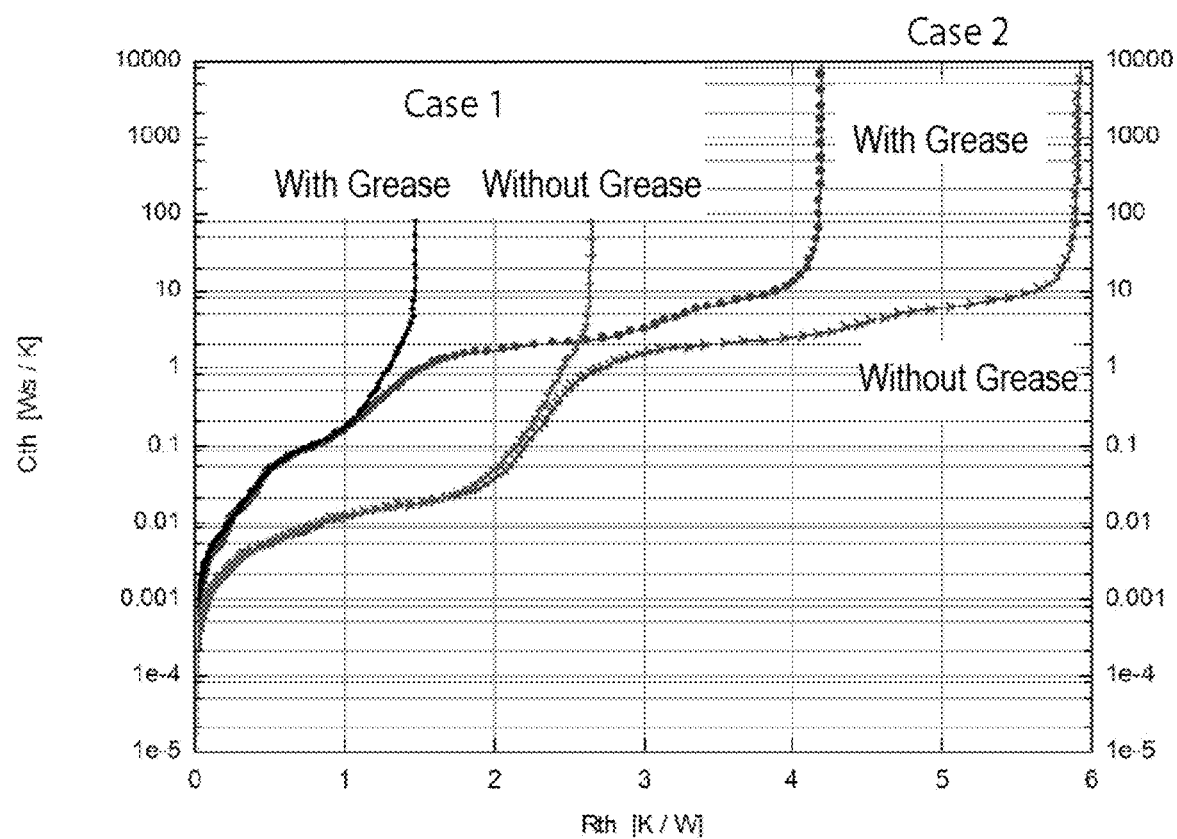
FIG. 26 is a diagram illustrating the measurement results of the thermal transient property of a sample.

FIG. 26 is a diagram illustrating the measurement results of the thermal transient property. A diode power switching element is used for the sample, and measurements were taken for Case 1 in which the first surface was cooled, and Case 2 in which the second surface was cooled. For both cases, the measurements were taken for a configuration in which grease is provided between the power switching element and the water-cooling unit, and a configuration in which grease is not provided. T3Ster was used for the measurements. In FIG. 26, the horizontal axis indicates the heat resistance (accumulative heat resistance) Rth [K/W] of the heat transfer channel, and the vertical axis indicates the heat capacity (accumulative heat capacity) Cth [Ws/K]. The left side of the graph indicates a heat source (chip), and the closer it is to the right side, the greater the distance from the heat source is, and the more heat is dissipated into the atmosphere (ambient temperature). The curved line in the middle represents the heat property of the heat transfer channel of the implemented structure; a larger gradient means a structure with a lower heat resistance, and a smaller gradient means a structure with a higher heat resistance. When the device is cooled from the first surface, a high cooling efficiency is achieved as compared with the case where the device is cooled from the second surface.

FIG. 26 shows that both in Case 1 where the device is cooled from the first surface and Case 2 where the device is cooled from the second surface, grease in the water-cooling unit improves heat conductivity. When grease is provided, in Case 1 where the device is cooled from the first surface, heat is released from the upper electrode, and the heat resistance Rth is reduced to approximately 40% as compared with Case 2 where the device is cooled from the second surface, which is approximately 60% reduction.

Figure 27A:
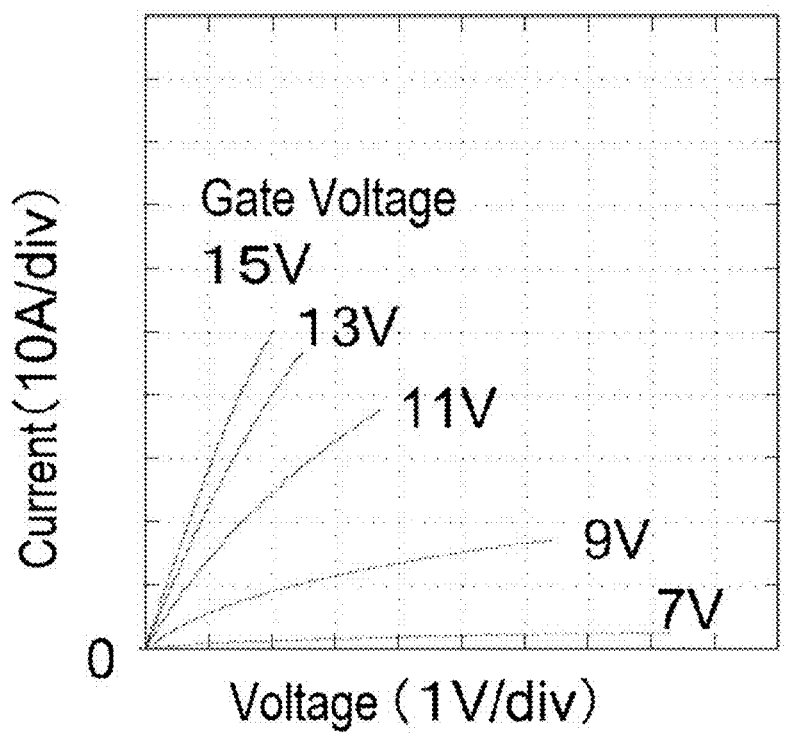
FIG. 27A is a diagram illustrating the drain current property relative to the drain voltage when the gate voltage is set as a parameter in the measurement results of the electric properties of the sample.
Figure 27B:
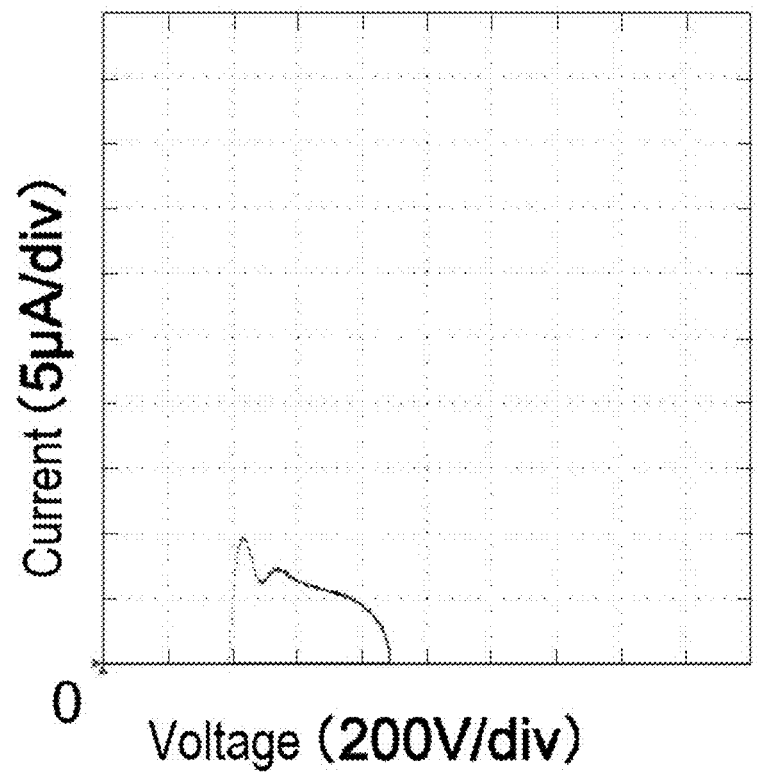
FIG. 27B is a diagram illustrating the voltage resistance results in the measurement results of the electric properties of the sample.

FIGS. 27A and 27B are diagrams illustrating the measurement results of the electrical property of the sample. FIG. 27A is a diagram illustrating the drain current property relative to the source-drain voltage when the gate voltage is set as a parameter. That is, FIG. 27A illustrates the drain current relative to the source-drain voltage when the gate voltage is set to 7V, 9V, 11V, 13V, and 15V, respectively. In the manufactured power semiconductor device, after confirming that the source-drain voltage was 2V and the drain current was 20A, the gate and the source were short-circuited, and a current that flows between the source and drain when a voltage was applied between the source and drain was measured using a curve tracer. Based on the results shown in FIG. 27B, the breakdown voltage was at 900V, which is considered high.

It is needless to say that one embodiment of the present invention may be combined with part of another embodiment, or each embodiment may be modified appropriately.

What is claimed is:

1. A power semiconductor device, comprising:
    a power semiconductor chip having a first surface and a second surface opposite to each other, the power semiconductor chip including
        an insulating layer disposed on the first surface of the power semiconductor chip, the insulating layer having first and second through-holes,
        a first electrode and a second electrode respectively formed in the first and second through-holes of the insulating layer on the first surface of the power semiconductor chip, the first electrode being provided in a main cell area of the power semiconductor chip, and
        a third electrode on the second surface of the power semiconductor chip;
    a fourth electrode provided on the first surface of the power semiconductor chip, at least a part of the fourth electrode being disposed in the first through-hole of the insulating layer to be electrically connected to the first electrode, the fourth electrode having an overhanging portion that extends outwardly from an outer edge of the power semiconductor chip; and
    a sixth electrode provided on the first surface of the power semiconductor chip and being electrically connected to the second electrode, the sixth electrode having an overhanging portion that extends outwardly from the outer edge of the power semiconductor chip.

2. A power semiconductor device, according to claim 1, wherein the power semiconductor chip is provided in plurality, and the fourth electrode is commonly and electrically connected to the first electrode of each of the plurality of the power semiconductor chips.

3. The power semiconductor device according to claim 1, further comprising a fifth electrode provided on the second surface of the power semiconductor chip and being electrically connected to the third electrode.

4. The power semiconductor device according to claim 3, wherein
    the fifth electrode includes a first metal layer disposed on the third electrode, and having a first surface facing the third electrode and a second surface opposite to the first surface, and a second metal layer disposed on the second surface of the first metal layer, and having a first surface facing the first metal layer and a second surface opposite to the first surface, and the first metal layer of the fifth electrode is a Cu layer, an Al layer, or an alloy layer containing Cu or Al.

5. The power semiconductor device according to claim 1, wherein the power semiconductor chip includes a termination structure disposed on the first surface thereof between the outer edge and the main cell area, and the fourth electrode includes a first metal layer configured such that at least a part thereof is disposed in the through-hole of the insulating layer to be electrically connected to the first electrode, the first metal layer having a first surface and a second surface that is opposite to the first surface and faces the insulating layer, the first metal layer overlapping at least partially the first electrode and overlapping at least partially the insulating layer on the termination structure, in a plan view of the power semiconductor device.

6. The power semiconductor device according to claim 5, wherein the fourth electrode further includes a second metal layer provided on the first surface of the first metal layer, and the overhanging portion of the fourth electrode is constituted of at least a part of the second metal layer.

7. The power semiconductor device according to claim 5, wherein the first metal layer of the fourth electrode is a Cu layer, an Al layer, or an alloy layer containing Cu or Al.

8. The power semiconductor device according to claim 1, wherein an area of the overhanging portion of the fourth electrode in a plan view of the power semiconductor device is at least 20% of the main cell area of the power semiconductor chip.

9. The power semiconductor device according to claim 1, wherein the power semiconductor chip includes a termination structure disposed on the first surface between the outer edge and the main cell area, the power semiconductor chip further includes an insulating layer provided at least on the termination structure and having a through-hole, the power semiconductor device further comprising a sixth electrode including a first metal layer having a first surface and a second surface opposite to each other, the first metal layer being configured such that at least a part thereof is provided in the through-hole of the insulating layer to be electrically connected to the second electrode, the first metal layer overlapping at least partially the second electrode and overlapping at least partially the insulating layer on the termination structure in a plan view of the power semiconductor device, the second surface of the first metal layer facing the insulating layer, and a second metal layer provided on the first surface of the first metal layer at a distance from the second electrode so that the second metal layer does not overlap the second electrode in the plan view.

10. The power semiconductor device according to claim 9, wherein the overhanging portion of the sixth electrode includes the second metal layer.

11. The power semiconductor device according to claim 1, further comprising an insulating enclosure that encloses outer side faces of the power semiconductor chip and that has a first side and a second side opposite to each other, wherein the overhanging portion of the fourth electrode is provided at the first side of the enclosure.

12. The power semiconductor device according to claim 11, further comprising a fifth electrode provided on the second surface of the power semiconductor chip and being electrically connected to the third electrode, wherein the fifth electrode includes a first metal layer disposed on the third electrode, and having a first surface facing the third electrode and a second surface opposite to the first surface, a surface at the second side of the enclosure is flush with the second surface of the first metal layer of the fifth electrode, whereby the first metal layer does not go beyond the enclosure in a width direction of the power semiconductor chip.

13. A power semiconductor module, comprising:

one or a plurality of the power semiconductor device according to claim 1; and one metal layer provided outside of the power semiconductor chip in a direction parallel to the first surface of the power semiconductor chip as a part of the fourth electrode such that the one metal layer is electrically to be connected to an external terminal.

14. A power semiconductor module having a first side and a second side opposite to each other, comprising:

a plurality of power semiconductor devices each having a first side and second side opposite to each other and belonging to a first group; and another plurality of power semiconductor devices each having a first side and second side opposite to each other and belonging to a second group separate from the first group;

wherein each of the power semiconductor devices of the first group and the second group includes:

a power semiconductor chip having a first surface and a second surface opposite to each other, the power semiconductor chip including a first electrode and a second electrode on the first surface thereof, and a third electrode on the second surface thereof, the first electrode being provided in a main cell area of the first surface;

a fourth electrode provided on the first surface of the power semiconductor chip and being electrically connected to the first electrode, the fourth electrode having an overhanging portion that extends outwardly from an outer edge of the power semiconductor chip;

a fifth electrode provided on the second surface of the power semiconductor chip and being electrically connected to the third electrode of the power semiconductor chip; and a sixth electrode provided on the first surface of the power semiconductor chip and being electrically connected to the second electrode of the power semiconductor chip, wherein the first side of each of the power semiconductor devices in the first group and the second side of each of the power semiconductor devices in the second group are both arranged to be located at one of the first side or the second side of the semiconductor module, and wherein the fourth electrode, the fifth electrode and the sixth electrode of each of the power semiconductor devices in the first group and each of the power semiconductor devices in the second group are respectively disposed to be electrically connected to corresponding external terminals for the fourth electrode, the fifth electrode, or the sixth electrode of each group.

15. The power semiconductor module according to claim 14, wherein at least one of the power semiconductor devices in the first group or at least one of the power semiconductor devices in the second group includes a plurality of power semiconductor chips.

16. The power semiconductor module according to claim 14, further comprising a plurality of capacitors each disposed between the fourth electrode of a corresponding one of the power semiconductor devices in the first group and the fifth electrode of a corresponding one of the power semiconductor devices in the second group.

17. A power semiconductor device, comprising:
a power semiconductor chip having a first surface and a second surface opposite to each other, the power semiconductor chip including a first electrode and a second electrode on the first surface thereof, and a third electrode on the second surface thereof, the first electrode being provided in a main cell area of the first surface;
a fourth electrode provided on the first surface of the power semiconductor chip and being electrically connected to the first electrode, the fourth electrode having an overhanging portion that extends outwardly from an outer edge of the power semiconductor chip; and
a fifth electrode provided on the second surface of the power semiconductor chip and being electrically connected to the third electrode; wherein
the fifth electrode includes:
a first metal layer disposed on a lower surface of the third electrode, the lower surface being opposite to an upper surface of the third electrode that faces the power semiconductor chip, and
a second metal layer disposed on a lower surface of the first metal layer, the lower surface being opposite to an upper surface of the first metal layer that faces the third electrode.

18. A power semiconductor device, according to claim 17, wherein the power semiconductor chip is provided in plurality, and the fourth electrode is commonly and electrically connected to the first electrode of each of the plurality of the power semiconductor chips.

19. A power semiconductor device, comprising:
a power semiconductor chip having a first surface and a second surface opposite to each other, the power semiconductor chip including a first electrode and a second electrode on the first surface thereof, and a third electrode on the second surface thereof, the first electrode being provided in a main cell area of the first surface;
a fourth electrode provided on the first surface of the power semiconductor chip and being electrically connected to the first electrode, the fourth electrode having an overhanging portion that extends outwardly from an outer edge of the power semiconductor chip; and
a sixth electrode provided on the first surface of the power semiconductor chip and being electrically connected to the second electrode, the sixth electrode having an overhanging portion that extends outwardly from the outer edge of the power semiconductor chip, wherein
an area of the overhanging portion of the fourth electrode in a plan view of the power semiconductor device is at least 20% of the main cell area of the power semiconductor chip.

20. The power semiconductor device according to claim 19, further comprising a fifth electrode provided on the second surface of the power semiconductor chip and being electrically connected to the third electrode.

* * * * *